(12) United States Patent
Miller et al.

(10) Patent No.: US 6,497,356 B2
(45) Date of Patent: Dec. 24, 2002

(54) CONTROLLED ATTENUATION CAPILLARY WITH PLANAR SURFACE

(75) Inventors: Amir Miller, Ambler, PA (US); Gil Perlberg, Ya'akov (IL)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/886,560

(22) Filed: Jun. 21, 2001

(65) Prior Publication Data

US 2002/0033408 A1 Mar. 21, 2002

Related U.S. Application Data

(63) Continuation-in-part of application No. 09/795,270, filed on Feb. 28, 2001, which is a continuation-in-part of application No. 09/561,304, filed on Apr. 28, 2000, now Pat. No. 6,321,969.

(51) Int. Cl.[7] .............................................. B23K 37/00
(52) U.S. Cl. ...................... 228/4.5; 228/1.1; 228/180.5
(58) Field of Search ........................ 228/1.1, 4.5, 110.1, 228/180.5, 904

(56) References Cited

U.S. PATENT DOCUMENTS

| | | |
|---|---|---|
| 3,894,671 A | 7/1975 | Kulicke, Jr. et al. |
| 3,917,148 A | 11/1975 | Runyon |
| 4,315,128 A | 2/1982 | Matcovich et al. |
| 4,513,190 A | 4/1985 | Ellett et al. |
| 5,377,894 A | 1/1995 | Mizoguchi et al. |
| 5,558,270 A | 9/1996 | Nachon et al. |
| 5,890,643 A | 4/1999 | Razon et al. |
| 5,971,248 A | 10/1999 | Koduri |
| 6,006,977 A | 12/1999 | Koduri |
| 6,073,827 A | 6/2000 | Razon et al. |
| 6,112,972 A | 9/2000 | Koduri |

OTHER PUBLICATIONS

F. Osterwald et al., *Increasing Bond Quality by Ultrasonic Vibration Monitoring*, ISHM—Preceedings of SPIE—The International Society for Optical Engineering (Oct. 1996), pp. 426–431.

A. Wilson et al, *Holographic Interferometry Applied to Motion Studies of Ultrasonic Bonders*, IEEE Transaction on Sonics and Ultrasonics, New York, Institute of Electrical and Electronic Engineers (1972), SU–19 (4), pp. 453–461.

Primary Examiner—M. Alexandra Elve
Assistant Examiner—Zidia Pittman
(74) Attorney, Agent, or Firm—RatnerPrestia

(57) ABSTRACT

A controlled attenuation bonding tool for bonding a fine wire to a substrate. The bonding tool comprises a first cylindrical section having a substantially uniform first diameter and a second cylindrical section with a substantially uniform second diameter less than the first diameter. The second cylindrical section is coupled to an end of the first cylindrical section and has a planar area along at least a portion of a length of the second section.

27 Claims, 23 Drawing Sheets

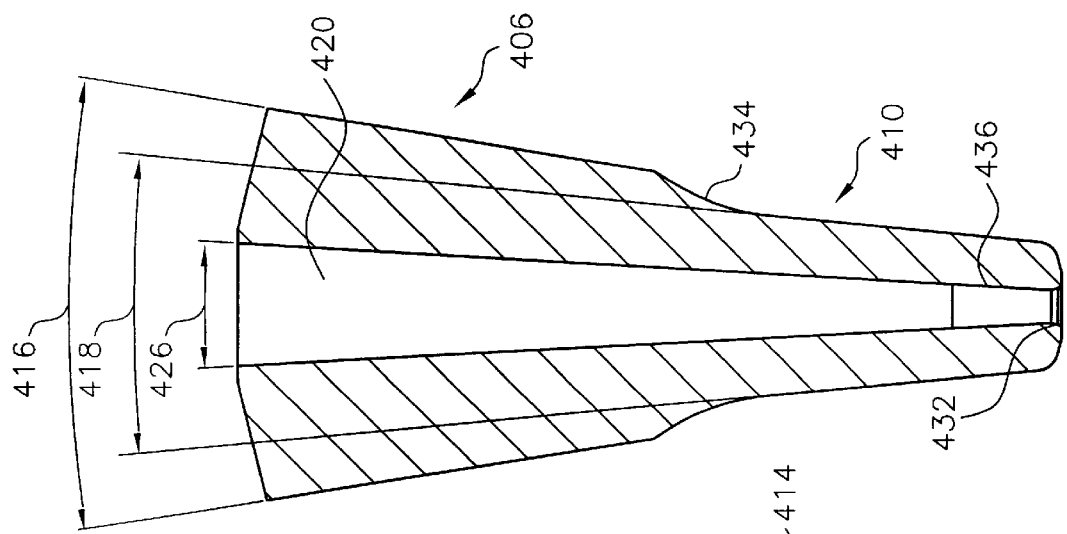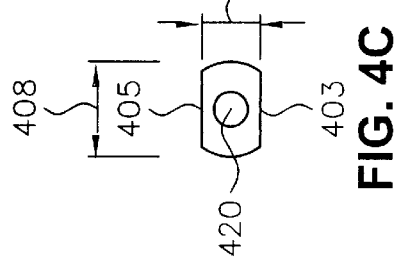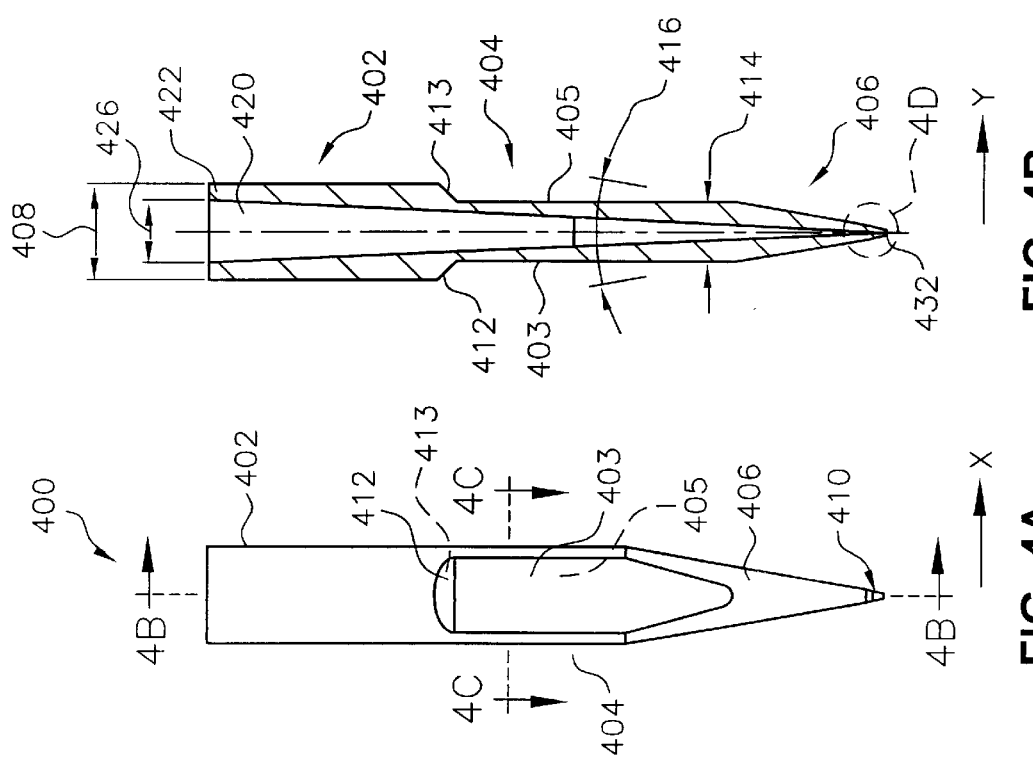

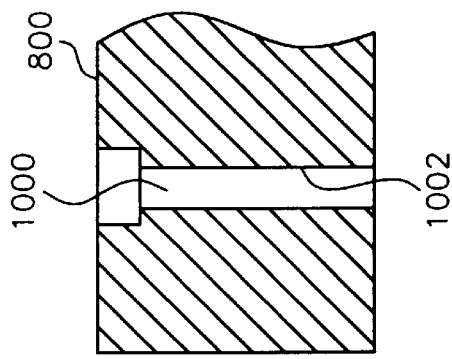
FIG. 10A
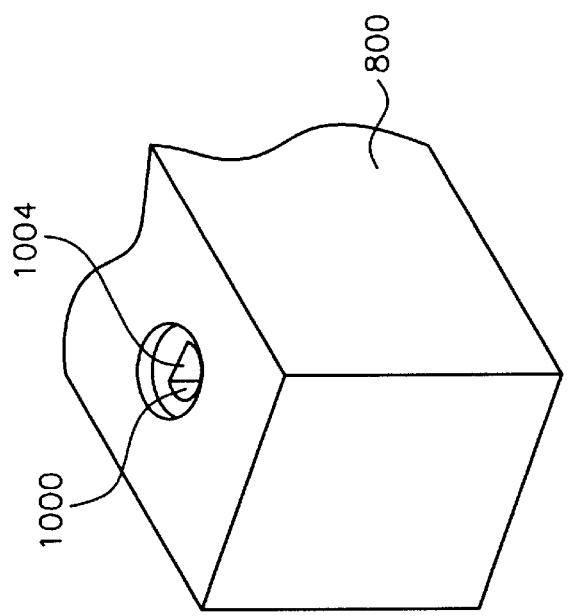
FIG. 10B
FIG. 10D
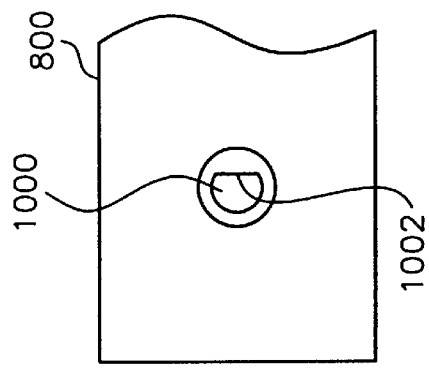
FIG. 10C

CONTROLLED ATTENUATION CAPILLARY WITH PLANAR SURFACE

This application is a Continuation-in-Part of pending application Ser. No. 09/795,270 filed on Feb. 28, 2001 which is a Continuation-in-Part of application Ser. No. 09/561,304 now U.S. Pat. No. 6,321,969 filed on Apr. 28, 2000.

BACKGROUND OF THE INVENTION

This invention relates generally to a tool for use in the bonding of wire to semiconductor devices and, more particularly to a bonding tool having controlled attenuation characteristics.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate. Particularly, the connecting wires are supplied and bonded to the chip and to the substrate through a capillary, a bonding tool further described below.

Capillaries are used for ball bonding the wire to electronic devices, particularly to bond pads of semiconductor devices. Such capillaries are generally formed from a ceramic material, principally aluminum oxide, tungsten carbide, ruby, zircon toughened alumina (ZTA), alumina toughened zircon (ATZ) and other materials. Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond between the wire and the bond pad.

The capillary then handles the wire during looping, smoothly feeding the bond wire both out of the capillary and then back into the capillary. The capillary then forms a "stitch" bond and a "tack" or "tail" bond.

Presently, thermosonic wire bonding is the process of choice for the interconnection of semiconductor devices to their supporting substrates. The thermosonic bonding process is partially dependent upon the transfer of ultrasonic energy from the transducer, attached to a movable bondhead, through a tool, e.g. capillary or wedge, to the ball or wire being welded to the semiconducting device or supporting substrate.

In conventional capillaries (bonding tools), the geometry of the bonding tool is not engineered to modify energy transfer to the ball/wire interconnection pad interfacial area. The inventors of the present invention have determined that control of the ultrasonic attenuation of the tool is crucial to controlling the bonding process and its performance.

Conventional bonding tool design is deficient, however, because conventional bonding tool design is based on interconnection pitch and wire bond loop height and does not consider controlling ultrasonic attenuation.

FIG. 1 is an illustration of a conventional bonding tool. As shown in FIG. 1, bonding tool 100 has a cylindrical body portion 102 and a tapered portion 104. An axial passage 108 extends from the end 110 to the tip 106 of the bonding tool 100. A bonding wire (not shown) passes through axial passage 108 and through tip 106 for eventual bonding on a substrate (not shown).

SUMMARY OF THE INVENTION

To solve the aforementioned disadvantages of conventional bonding tools, the present invention relates to a bonding tool that produces controlled direction and gain of tool attenuation.

The bonding tool comprises a first cylindrical section having a substantially uniform first diameter; a second cylindrical section having a first end coupled to an end of the first cylindrical section, the second cylindrical section having a substantially uniform second diameter less than the first diameter; and a third section having a predetermined taper, a first end of the third section coupled to an end of the second cylindrical section.

According to another aspect of the present invention, the bonding tool comprises a first cylindrical section having a substantially uniform first diameter; a second section having a first end coupled to a first end of the first cylindrical section, the second cylindrical section having i) a diameter substantially equal to the first diameter of the first cylindrical section and ii) a planar area along at least a portion of a length of the second section; and a third section having a predetermined taper, a first end of the third section coupled to an end of the second cylindrical section.

According to yet another aspect of the present invention, the bonding tool comprises a first section having a substantially uniform first diameter, the first section having a planar portion formed along at least a portion of a length of the first section; a second cylindrical section having a first end coupled to an end of the first section, the second cylindrical section having a substantially uniform second diameter about equal to the first diameter; and a third section having a predetermined taper, a first end of the third section coupled to a second end of the second cylindrical section.

According to a further aspect of the present invention, the bonding tool comprises a first cylindrical section having a substantially uniform first diameter; and a second cylindrical section having a first end coupled to an end of the first cylindrical section, the second cylindrical section having i) a substantially uniform second diameter less than the first diameter and ii) a planar area along at least a portion of a length of the second section.

According to one aspect of the present invention, the bonding tool is formed from a unitary piece of material.

According to another aspect of the present invention, a transition section is coupled between the first section and the second section.

According to a further aspect of the present invention, the tapered section has a further tapered section at an end thereof.

According to yet another aspect of the present invention, a positioning guide is disposed at a second end of the first section of the bonding tool.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 4A–4E are various views of a bonding tool according to a second exemplary embodiment of the present invention;

FIGS. 10A–10D and 11A–11E illustrate details of an ultrasonic transducer with respect to mating the bonding tool of FIGS. 9A–9F;

DETAILED DESCRIPTION

The present invention overcomes the deficiencies of conventional capillary bonding tools by varying the mass distribution along the length of the bonding tool. The resultant bonding tool requires less ultrasonic energy to form a bond on a substrate when compared to conventional bonding tools. The direction of the ultrasonic attenuation can be controlled and modified by an appropriate design as discussed further herein.

The design of ultrasonic bonding tools may be accomplished by mathematically describing the motion of the tool driven by an ultrasonic transducer. Such a system is represented by a cantilever beam as shown in equation (1):

$$\frac{\partial^2}{\partial z^2}\left[EI(z)\frac{\partial^2 x(z,t)}{\partial z^2}\right] + m(z)\frac{\partial^2 x(z,t)}{\partial t^2} = -m(z)\frac{\partial^2 x_o(t)}{\partial t^2} \quad \text{Eq. 1}$$

Where E is the elastic modulus, I is the moment of inertia, m is the mass distribution, z is the distance from the moving support, x is the displacement normal to the beam and $x_o$ describes the motion of the moving support.

The boundary conditions for Eq. 1 are:

(1) $x(0, t) = x_0 \cdot e^{i\omega t}$ (2) $\dfrac{\partial x(0, t)}{\partial z} = 0$ (3) $m(l, t) = 0$ (4) $V(l, t) = Z_{LOAD} \dfrac{\partial x}{\partial t}\bigg|_{x=l}$ Where:

l—is the cantilever length

V—is the shear

Figure 1:
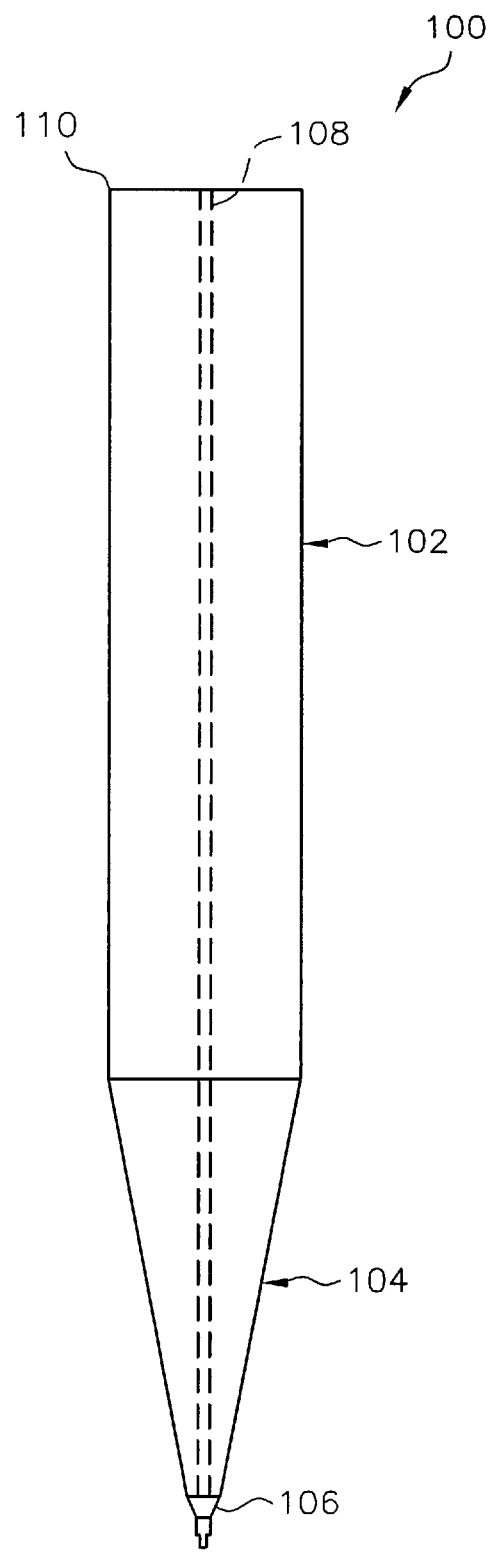
FIG. 1 is a side view of a conventional bonding tool.
Figure 2:
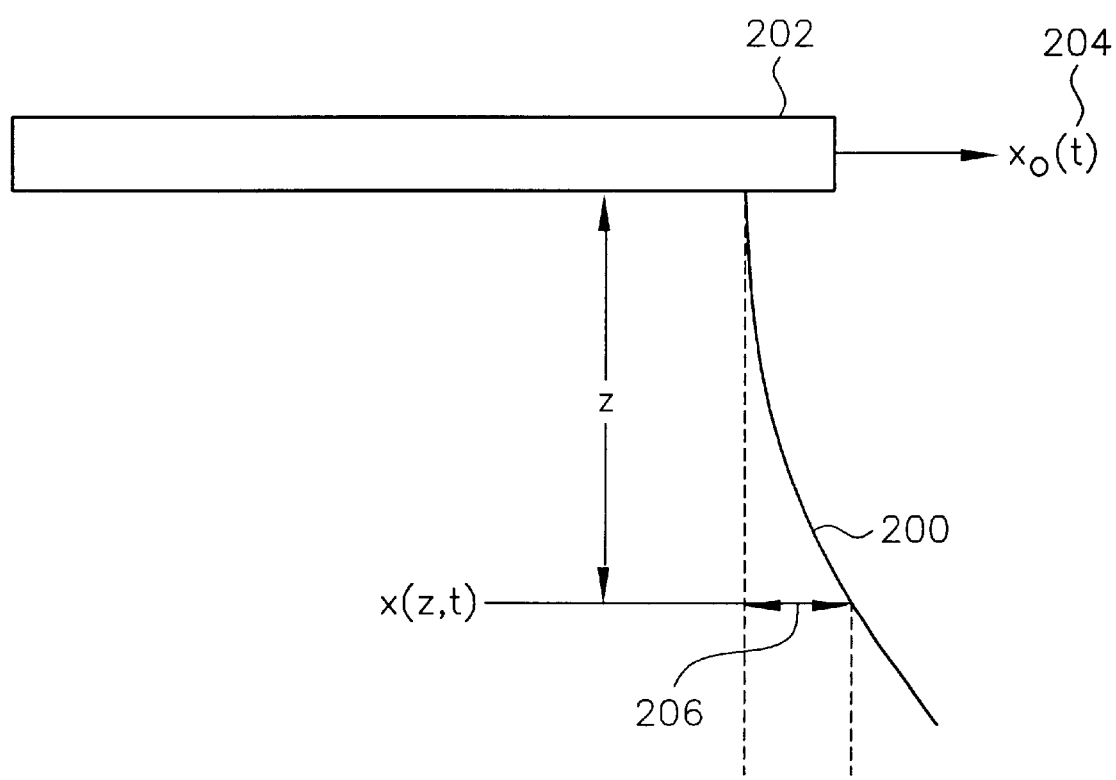
FIG. 2 is a illustration of bonding tool response with respect to transducer motion.

FIG. 2 illustrates the response of a bonding tool in accordance with equation (1). As shown in FIG. 2, for bonding tool design, the cantilever beam 200 represents the bonding tool, 204 the motion $x_o$ of the transducer 202, and 206 the bonding tool response motion x(z,t). Since the mass and moment of inertia are allowed to vary along the beam, these parameters may be used to design the composition and "shape" of a bonding tool to produce a desired bonding ultrasonic motion.

As mentioned above, in conventional designs, the moment of inertia I, and the mass distribution m are not controlled for the purpose of ultrasonic attenuation, but strictly for allowing the required interconnection pitch and wire bond loop height. In the exemplary embodiment of the present invention, the cross sectional shape and mass distribution are specified to control ultrasonic attenuation direction and/or gain.

Several examples of the effect of engineering the Area Moment of Inertia I, and the Mass Distribution m are given. Table 1, is a summation of experimental work associated with verification of this concept.

TABLE 1

| Capillary | Diameter 314 ($10^{-3}$ inch) | Width ($10^{-3}$ inch) | Height ($10^{-3}$ inch) |
| --- | --- | --- | --- |
| A1 | 16.0 (0.406 mm) | 17.2 (0.437 mm) | 165.6 (4.206 mm) |
| A2 | 14.7 (0.373 mm) | 17.0 (0.431 mm) | 174.3 (4.427 mm) |
| A3 | 13.7 (0.348 mm) | 17.8 (0.452 mm) | 183.3 (4.656 mm) |
| H1 | 16.0 (0.406 mm) | 17.2 (0.437 mm) | 184.4 (4.683 mm) |
| H2 | 16.5 (0.419 mm) | 17.4 (0.442 mm) | 151.4 (3.845 mm) |
| H3 | 16.6 (0.422 mm) | 16.4 (0.417 mm) | 140.7 (3.573 m) |
| W1 | 15.9 (0.404 mm) | 13.6 (0.345 mm) | 161.8 (4.110 mm) |
| W2 | 15.9 (0.404 mm) | 19.3 (0.490 mm) | 164.6 (4.181 mm) |

TABLE 1-continued

| Capillary | Diameter 314 ($10^{-3}$ inch) | Width ($10^{-3}$ inch) | Height ($10^{-3}$ inch) |
| --- | --- | --- | --- |
| D1 | 11.4 (0.289 mm) | 17.4 (0.442 mm) | 165.4 (4.201 mm) |
| D2 | 8.2 (0.208 mm) | 16.9 (0.429 mm) | 165.7 (4.209 mm) |
| H1D2 | 11.5 (0.292 mm) | 17.1 (0.434 mm) | 181.9 (4.620 mm) |
| H2D2 | 8.2 (0.208 mm) | 15.6 (0.419 mm) | 149.8 (3.805 mm) |

Figure 3C:
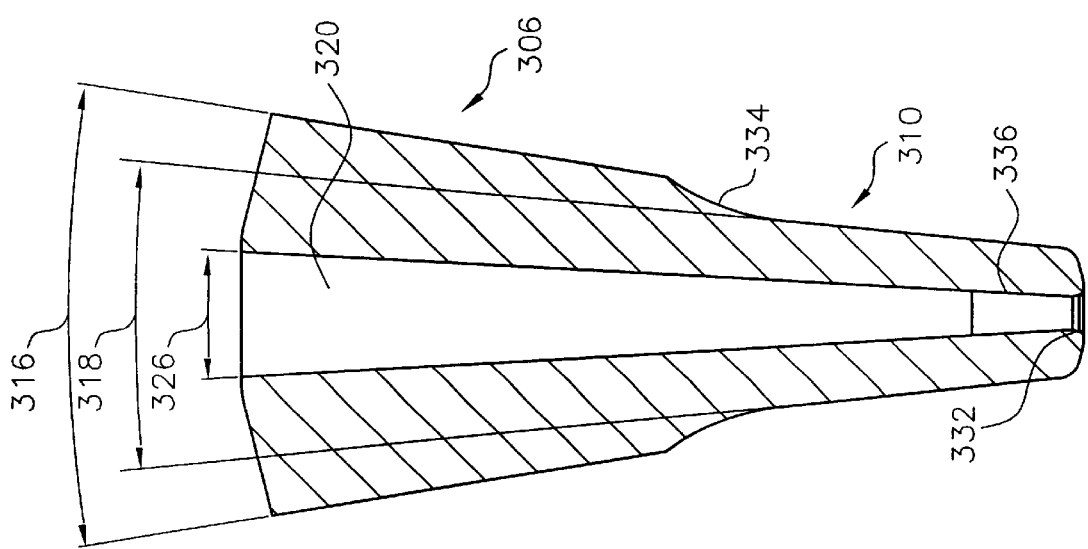
FIGS. 3A–3H are various views of a bonding tool according to a first exemplary embodiment of the present invention.
Figure 3B:
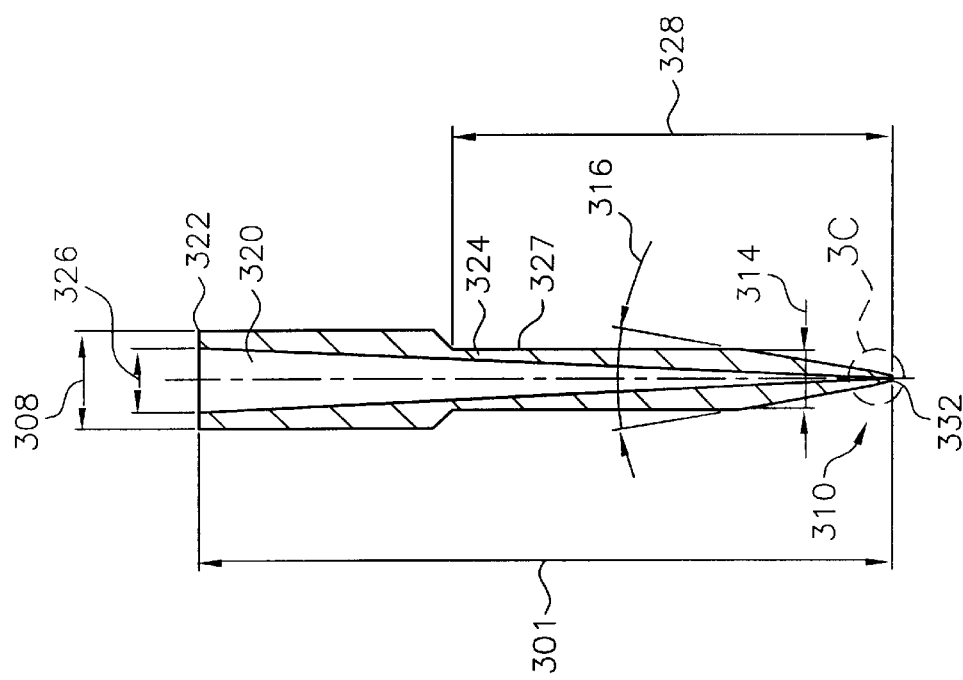
Figure 3A:
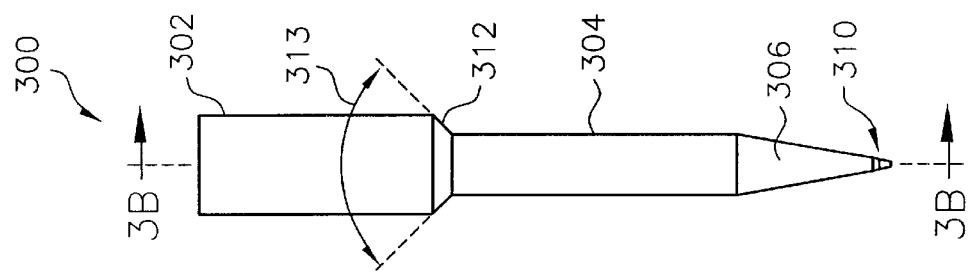
Figure 3E:
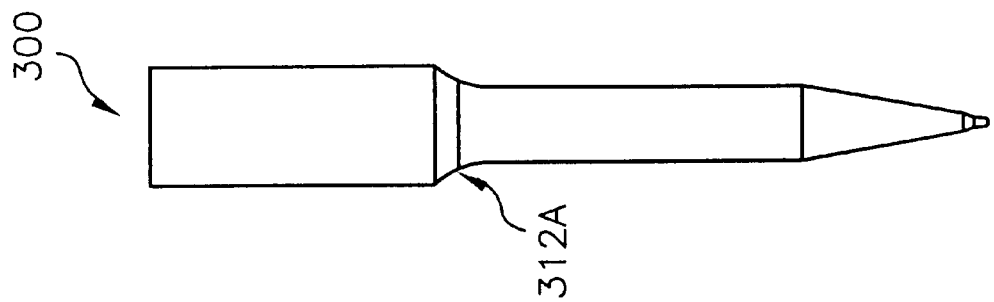
Figure 3D:
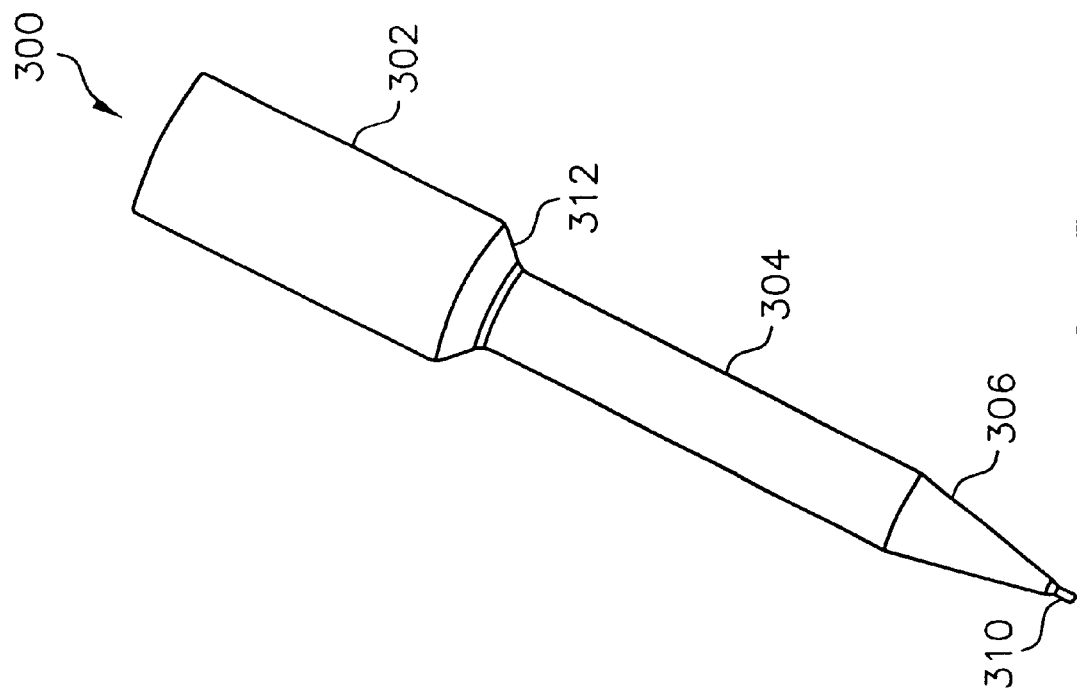

FIGS. 3A–3G are various views of a capillary bonding tool according to a first exemplary embodiment of the present invention. FIGS. 3A and 3D are a side view and perspective view, respectively, of a bonding tool 300 according to a first exemplary embodiment of the present invention. As shown in FIG. 3A, bonding tool 300 has an upper cylindrical body portion 302, a lower cylindrical body portion 304, and a conical body portion 306. Disposed between the upper cylindrical body portion 302 and the lower cylindrical body portion 304 is transition area 312. In this exemplary embodiment, transition area 312 has a beveled shape. The invention is not so limited, however, in that transition area 312 may have other shapes, such as curved shape 312A shown in FIG. 3E. In order to maintain a smooth transfer of energy across transition area 312, however, it is preferable that transition area 312 not have a sharp edge, such as that introduced if transition area 312 consisted of merely a "step down" between upper cylindrical body portion 302 and lower cylindrical body portion 304.

In the exemplary embodiment, the overall length 301 of bonding tool 300 is between about 0.300 and 0.600 in. (7.62 and 15.748 mm) and preferably about 0.437 in. (11.0 mm). The upper cylindrical portion 302 has a diameter 308 of between about 0.0625 and 0.0866 in. (1.5875 and 2.20 mm) and preferably about 0.0625 in. (1.59 mm). The lower cylindrical body portion 304 has a diameter 314 of between about 0.0342 and 0.0625 in. (0.86868 and 1.5875 mm) and begins at a position 328 between about 0.020 and 0.279 in. (5.08 and 7.0866 mm) from the end 332 of bonding tool 300. In a preferred embodiment of the present invention diameter 314 is about 0.0342 in. (0.868 mm). The angle 313 of transition area 312 is about 90°.

Figure 3G:
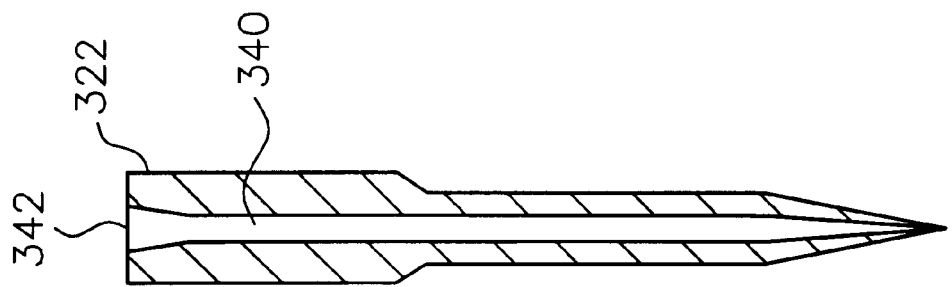
Figure 3F:
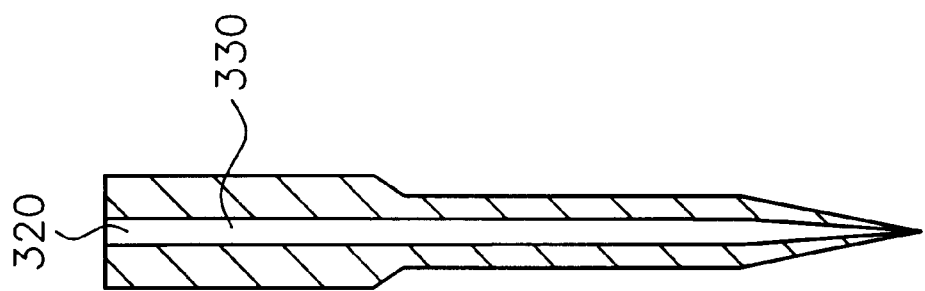

FIG. 3B is a sectional side view of bonding tool 300. As shown in FIG. 3B, axial passage 320 extends from the end 322 to end 332 of bonding tool 300. In the exemplary embodiment, axial passage 320 has a substantially continuous tapered shape having a predetermined angle 326 of between about 2° and 5° and preferably between about 2° and 3°. The invention is not so limited, however, and it is contemplated that the axial passage 320 may have a substantially constant diameter or tapered over only a portion of the length of bonding tool 300. The latter may be desired in order to facilitate wire insertion at the upper end 322 of bonding tool 300. Examples of such alternate axial passages are illustrated in FIGS. 3F and 3G. As shown in FIG. 3F, axial passage 320 has a substantially constant diameter 330 along a significant portion the length of bonding tool 300. In FIG. 3G, axial passage 320 has a substantially constant diameter 340 along a significant portion of the length of bonding tool 300, and has a taper 342 adjacent the end 322 of bonding tool 300.

Figure 3H:
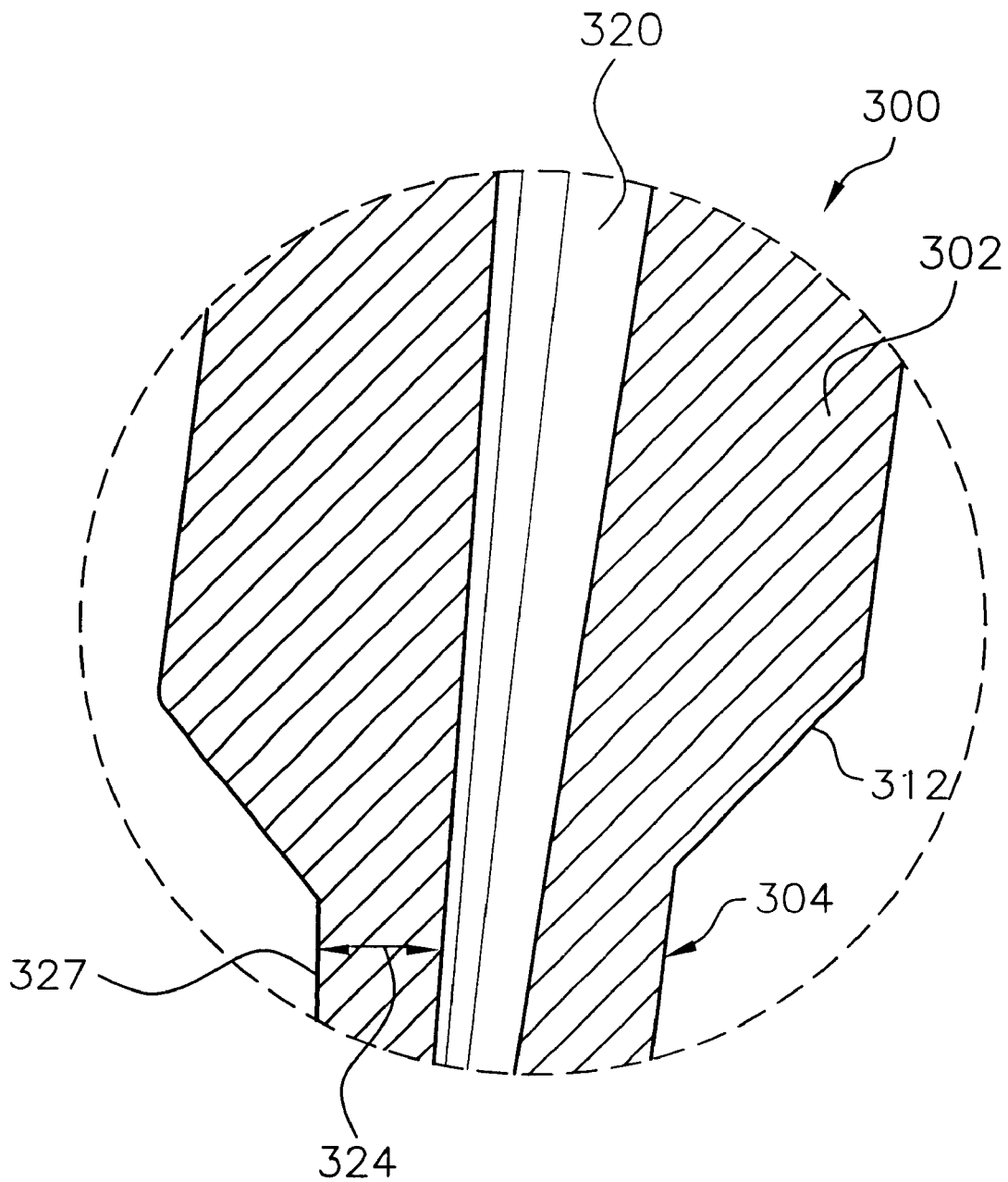

In order to maintain structural integrity of bonding tool 300, the distance between axial passage 320 and outer wall 327 must be considered during design of bonding tool 300. The inventors refer to this distance as the "Minimum Wall Thickness" (MWT) 324. Referring now to FIG. 3H, an enlarged cross section of bonding tool 300 is shown detailing MWT 324. In a preferred embodiment, the MWT 324 of bonding tool 300 is between about 0.0004–0.01625 in. (0.01 mm– 0.40 mm).

Referring to FIG. 3C, a detailed cross sectional view of conical body portion 306 is shown. In FIG. 3C, tip 310 extends from the lower end of conical body portion 306. In the exemplary embodiment, the outer angle 318 of tip 310 is between about 5° and 20° about preferably 10°, while the outer angle 316 of conical body portion 306 is between about 17° and 31°. As such, transition section 334 is used to transition between conical body portion 306 and tip 310. As shown in FIG. 3C, the angle of axial passage 320 remains substantially constant thorough the length of conical body portion 306 and a majority of the length of tip 310. At the lower portion of tip 310, however, the angle of axial passage 320, with respect to the longitudinal axis, diminishes to about 0°, thereby resulting in a substantially uniform diameter passage 336 through the remainder of tip 310.

As mentioned above, materials used to form capillary bonding tools include aluminum oxide, zirconium oxide, silicon nitride, silicon carbide, tungsten carbide, ruby, ZTA, and ATZ. It is contemplated that the exemplary bonding tools will be formed as a unitary piece by either machining and/or molding the aforementioned materials.

Figure 4E:
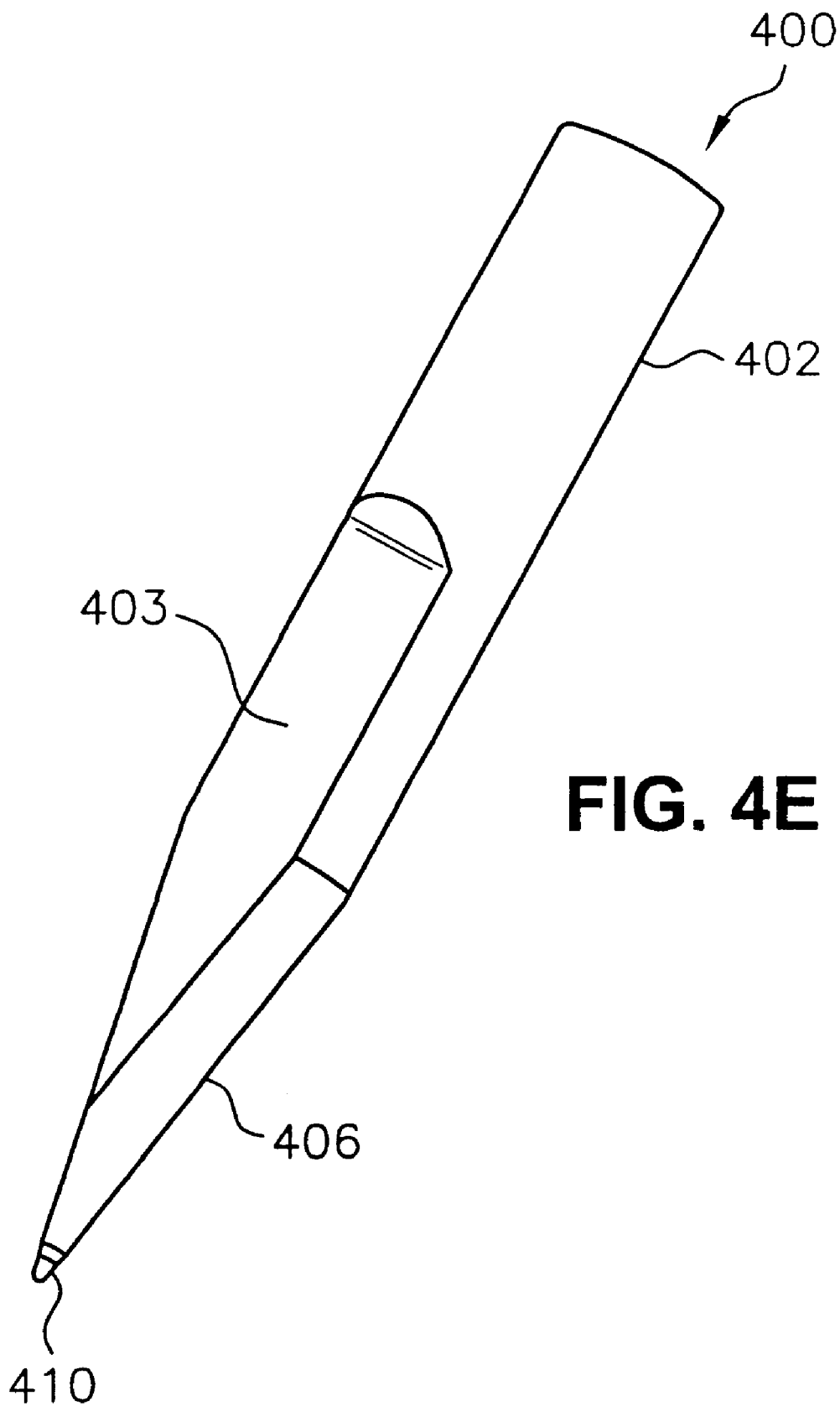

Referring to FIGS. 4A–4E a second exemplary embodiment of the present invention is shown. FIGS. 4A and 4E are a side view and a perspective view, respectively, of a bonding tool 400 according to the second exemplary embodiment of the present invention. As shown in FIG. 4A, bonding tool 400 has an upper cylindrical body portion 402, a lower body portion 404, and a conical body portion 406.

A notable difference between the first and second exemplary embodiments is that lower body portion 404 has planar portions 403, 405 parallel to one another on opposite sides of lower body portion 404. In the exemplary embodiment, the distance 414 between planar portion 403 and 405 is between about 0.0345 and 0.0625 in (0.8763 and 1.5875 mm). Another difference is that lower body portion 404 has a diameter substantially the same as diameter 408 of upper body portion 402. In a preferred embodiment, the diameter of the lower body portion 404 is the same as that of upper body portion 402. FIG. 4C is a plan view taken through cross section C—C of FIG. 4A showing the relationship between planar portions 403, 405 and diameter 408 of lower body portion 404.

FIG. 4B is a sectional side view of bonding tool 400. As shown in FIG. 4B, axial passage 420 extends from the end 422 to end 432 of bonding tool 400. In the exemplary embodiment, axial passage 420 has a substantially continuous tapered shape having a predetermined angle 426 (shown in detail in FIG. 4D) of between about 2° and 5° and preferably between about 2° and 3°. The invention is not so limited, however, and it is contemplated that the axial passage 420 may have a substantially constant diameter or tapered over only a portion of the length of bonding tool 400 similar to the first exemplary embodiment. Similar to the first exemplary embodiment, transition areas 412, 413 are used to transition from the upper cylindrical body portion 402 to the lower body portion 404 in the area of the planar portions 403, 405, respectively. Although the transition areas 412, 413 are shown in FIG. 4B to have a beveled shape (a planar flat surface), the inventors contemplate that a non-planar surface, such as a curved surface similar to that shown in FIG. 3D, may be used.

The inventors have found that by having a non-symmetrical shape, the bonding tool according to the second exemplary embodiment has a different stiffness along the x-axis when compared to the stiffness along the y-axis. This difference may be controlled by varying the length and/or width of planar portions 403, 405. As understood by those skilled in the art, the width of planar portions 403, 405 is directly related to the distance 414 between planar portions 403, 405. That is, the greater the width of planar portions 403, 405, the smaller the distance 414 between them.

In all other respects, the second exemplary embodiment is similar to the second exemplary embodiment.

Figure 5:
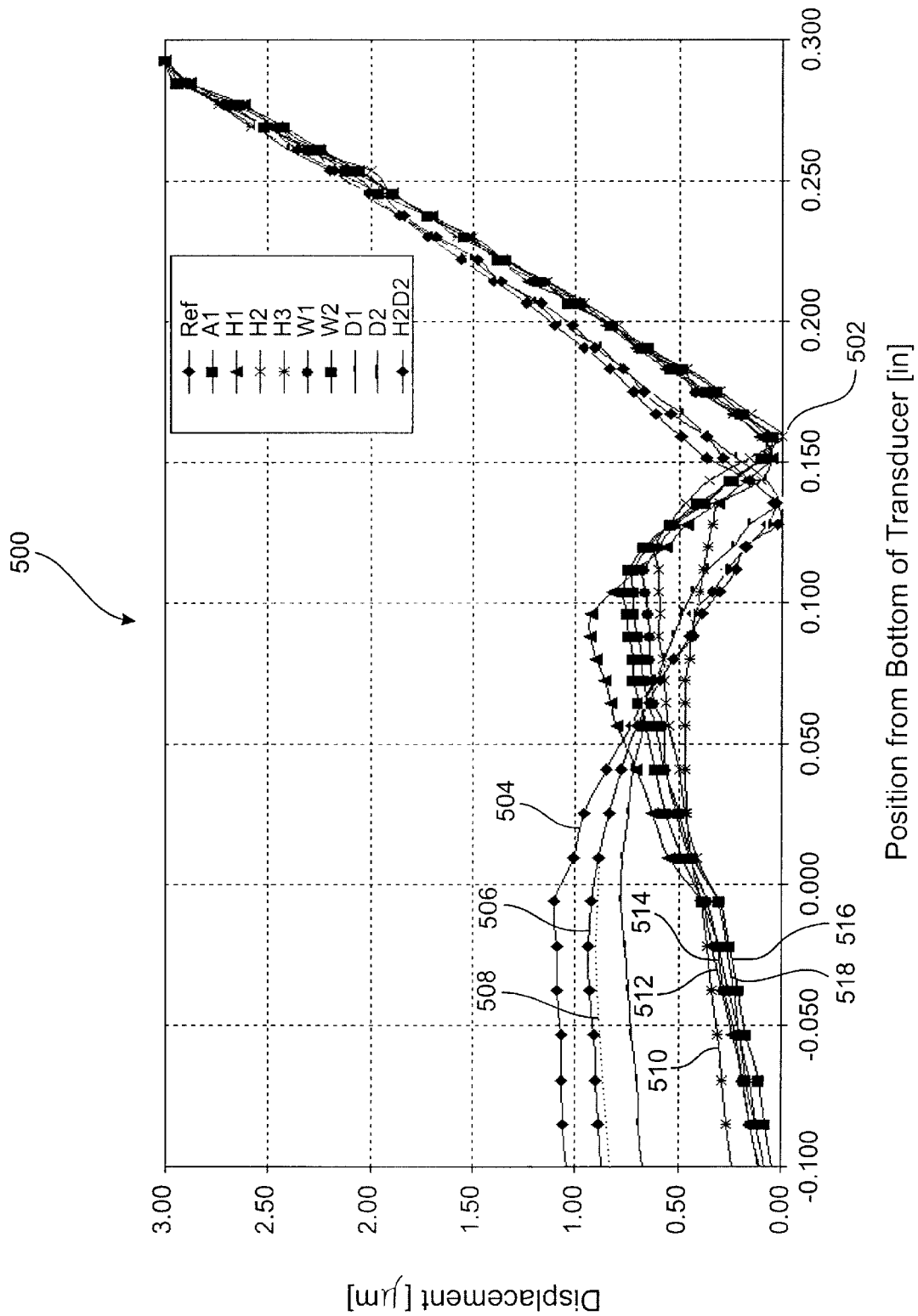
FIG. 5 is a graph plotting the effect of ultrasonic energy for a bonding tool according of an exemplary embodiment of the present invention.

Referring to FIG. 5, graph 500 is illustrated. In FIG. 5, graph 500 plots the effect of the reduced mass of lower body portion 304, 404 upon the displacement 206 (shown in FIG. 2) of the bonding tool 300, 400 due to the imposition of an ultrasonic wave along the length of the bonding tool 300, 400, from the transducer mount (not shown) to the free bonding end (tip 310, 410). In FIG. 5, the ordinate is the position from the bottom of the transducer in inches and the abscissa is displacement of the bonding tool in $\mu$m. Graph 500 is plotted for a variety of bonding tools in which the position and geometry of lower body portion 304, 404 varies. In FIG. 5, the position of the zero displacement tool motion due to ultrasonic energy at a fixed frequency is shown as node 502. In the present invention, the mass of lower body portion 304, 404 is adjusted to place the node of bonding tool 300, 400 at 502. The inventors have determined that adjusting the mass of lower body portion 304, 404 to place the node at 502 maximizes bonding tool efficiency. In FIG. 5, plot 504 illustrates the response of a conventional (reference) bonding tool, and plots 506–518 illustrate the response of bonding tools according to an exemplary embodiment of the present invention.

Figure 6:
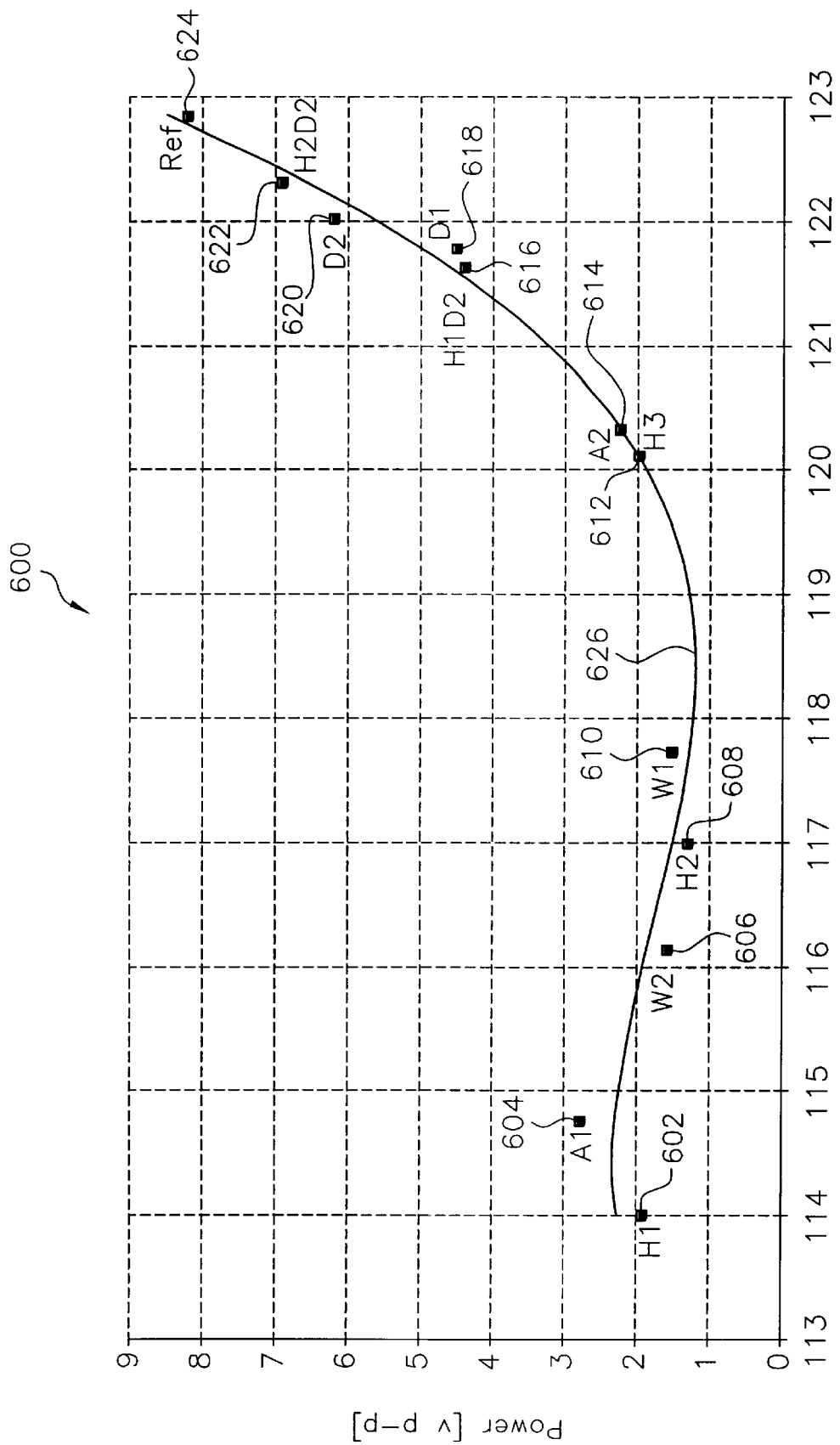
FIG. 6 is a is a graph plotting ultrasonic energy versus resonant frequency for a bonding tool according to an exemplary embodiment of the present invention.

In FIG. 6, graph 600 plots ultrasonic energy vs. frequency of resonance for a fixed tool tip displacement. In FIG. 6, resonance points 602–624 are shown and plotted as curve 626. As illustrated in FIG. 6, the point 624 represents the conventional reference tool and indicates a significantly higher energy requirement when compared to the tools according to the present invention (shown as points 602–622). Graph 600 illustrates that adjusting the mass of bonding tool 300, 400 in the lower body portion 304, 404 reduces the energy requirement significantly.

Figure 7:
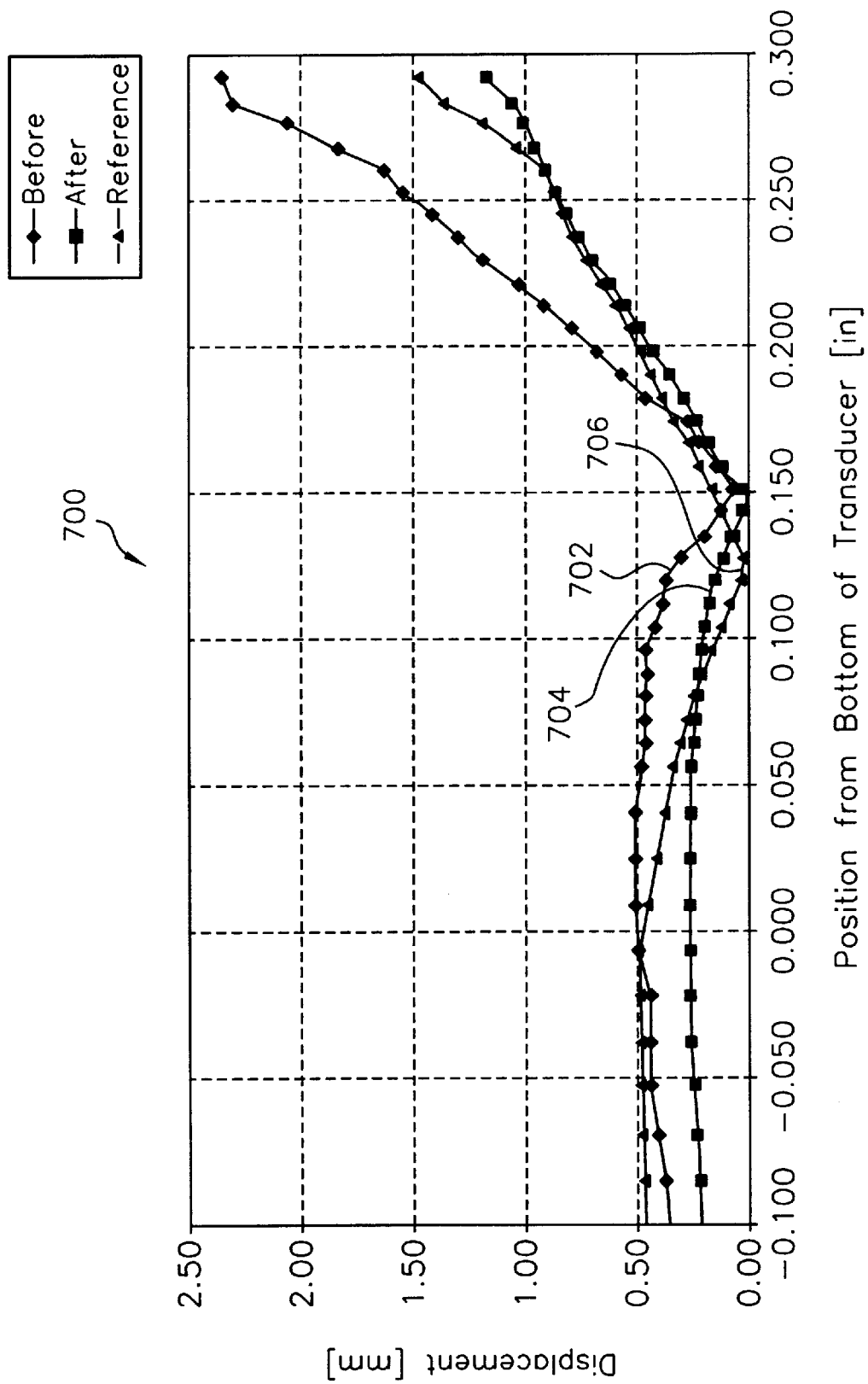
FIG. 7 is a is a graph plotting capillary displacement for a bonding tool according to an exemplary embodiment of the present invention.

In FIG. 7, graph 700 plots the displacement of bonding tools according to the present invention and a conventional bonding tool. As shown in FIG. 7, the displacement of a bonding tool, with its geometry optimized by control of the Area Moment of Inertia, I, by the machining of a the features illustrated in the exemplary embodiments, is greater than that of a standard shank bonding tool. Inspection of FIG. 7 shows that, for wire bonding, the plot of tip displacement is great than that of a standard bonding tool (curve 706) both before (curve 702) and after (curve 704) use of the controlled geometry capillary according to the present invention.

The inventors have also determined that the controlled attenuation of the exemplary bonding tool results in higher quality bonds. Table 2 is a compilation of data illustrating various bonding tools, bonding (ultrasonic) energy, bonding force, and shear force required to destroy the bond. As is clearly illustrated, the exemplary bonding tool, while using less than 50% of the energy of a conventional bonding tool, provided bonds than exhibit superior shear resistance.

TABLE 2

| Capillary | Shear/UA (gr/mil$^2$) | Ball Dia. ($\mu$m) | USG (mA) | Time (ms) | Force (gr) |
|---|---|---|---|---|---|
| Reference (conventional design) | 6.37 | 43.7 | 80 | 6 | 11 |
| 160W3 | 7.10 | 41.8 | 30 | 6 | 12 |

TABLE 2-continued

| Capillary | Shear/UA (gr/mil$^2$) | Ball Dia. ($\mu$m) | USG (mA) | Time (ms) | Force (gr) |
|---|---|---|---|---|---|
| 160W3-1 | 6.79 | 40.0 | 30 | 6 | 12 |
| 160W3-2 | 7.41 | 41.1 | 30 | 6 | 12 |
| 160W3-3 | 7.71 | 41.7 | 30 | 6 | 12 |
| 160W3-4 | 6.51 | 41.2 | 30 | 6 | 12 |
| 160W3-5 | 6.88 | 40.5 | 30 | 6 | 12 |

Table 3 is a compilation of data illustrating the superior pull resistance of bonds formed by bonding tools according to the present invention as compared to a conventional bonding tool.

TABLE 3

| Capillary | Pull X (gr) | Pull Y (gr) | Pull Avg. (gr) | USG (mA) | Time (ms) | Force (gr) |
|---|---|---|---|---|---|---|
| Reference (conventional design) | 7.15 | 7.08 | 7.11 | 65 | 5 | 120 |
| 160W3 | 7.24 | 7.04 | 7.14 | 35 | 6 | 100 |
| 160W3-1 | 7.00 | 7.12 | 7.06 | 35 | 6 | 100 |
| 160W3-2 | 7.33 | 7.23 | 7.28 | 35 | 6 | 100 |
| 160W3-3 | 7.81 | 7.36 | 7.58 | 35 | 6 | 100 |
| 160W3-4 | 7.15 | 7.25 | 7.20 | 35 | 6 | 100 |
| 160W3-5 | 7.28 | 7.16 | 7.22 | 35 | 6 | 100 |

Figure 8:
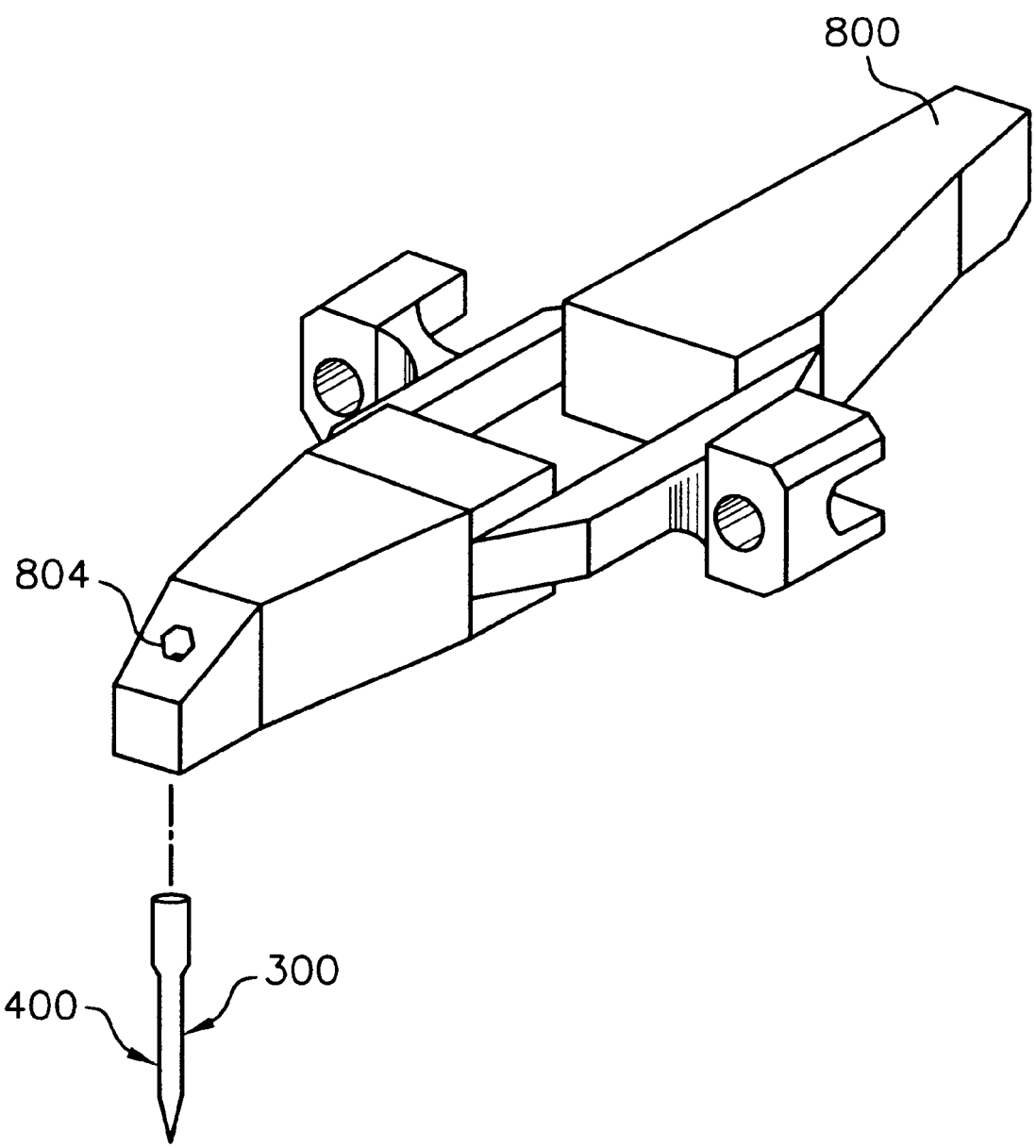
FIG. 8 is an illustration showing the interrelationship of an exemplary bonding tool with an ultrasonic transducer.

FIG. 8 is an illustration showing the interrelationship of an exemplary bonding tool 300, 400 with ultrasonic transducer 800. As shown in FIG. 8, bonding tool 300, 400 is inserted into orifice 804 of ultrasonic transducer 800.

The bonding tool 400, described above with respect to the second exemplary embodiment, has directional qualities due to the placement of planar areas 403, 405 in lower body portion 404. As a result, it may be desirable to orient bonding tool 400 within ultrasonic transducer 800 in order to direct more ultrasonic energy along one axis, versus the orthogonal axis, in an efficient manner. One way to ensure proper orientation is to place a locator on the bonding tool 400 that mates with a similar locator on the ultrasonic transducer. Exemplary approaches are explained with reference to FIGS. 9A–9F.

Figure 9A:
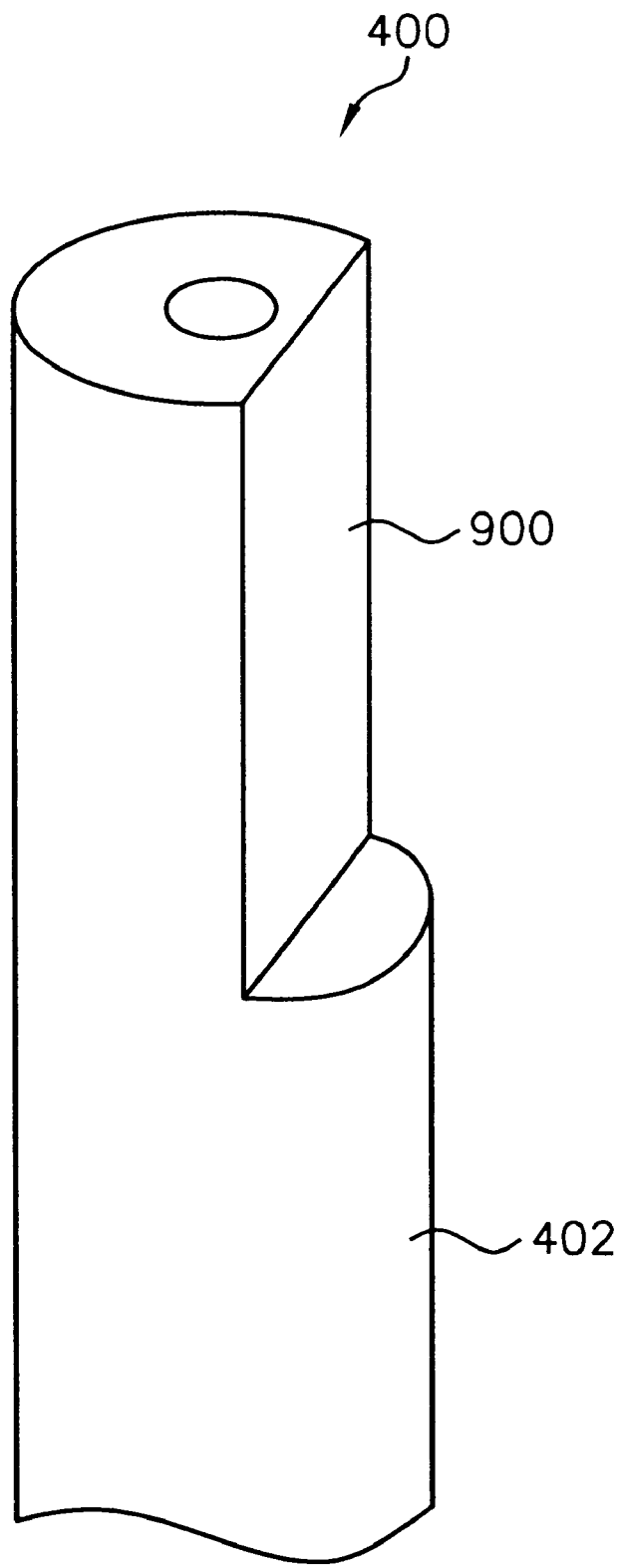
FIGS. 9A–9F are illustrations of exemplary approaches to orienting an exemplary bonding tool within an ultrasonic transducer.
Figure 9B:
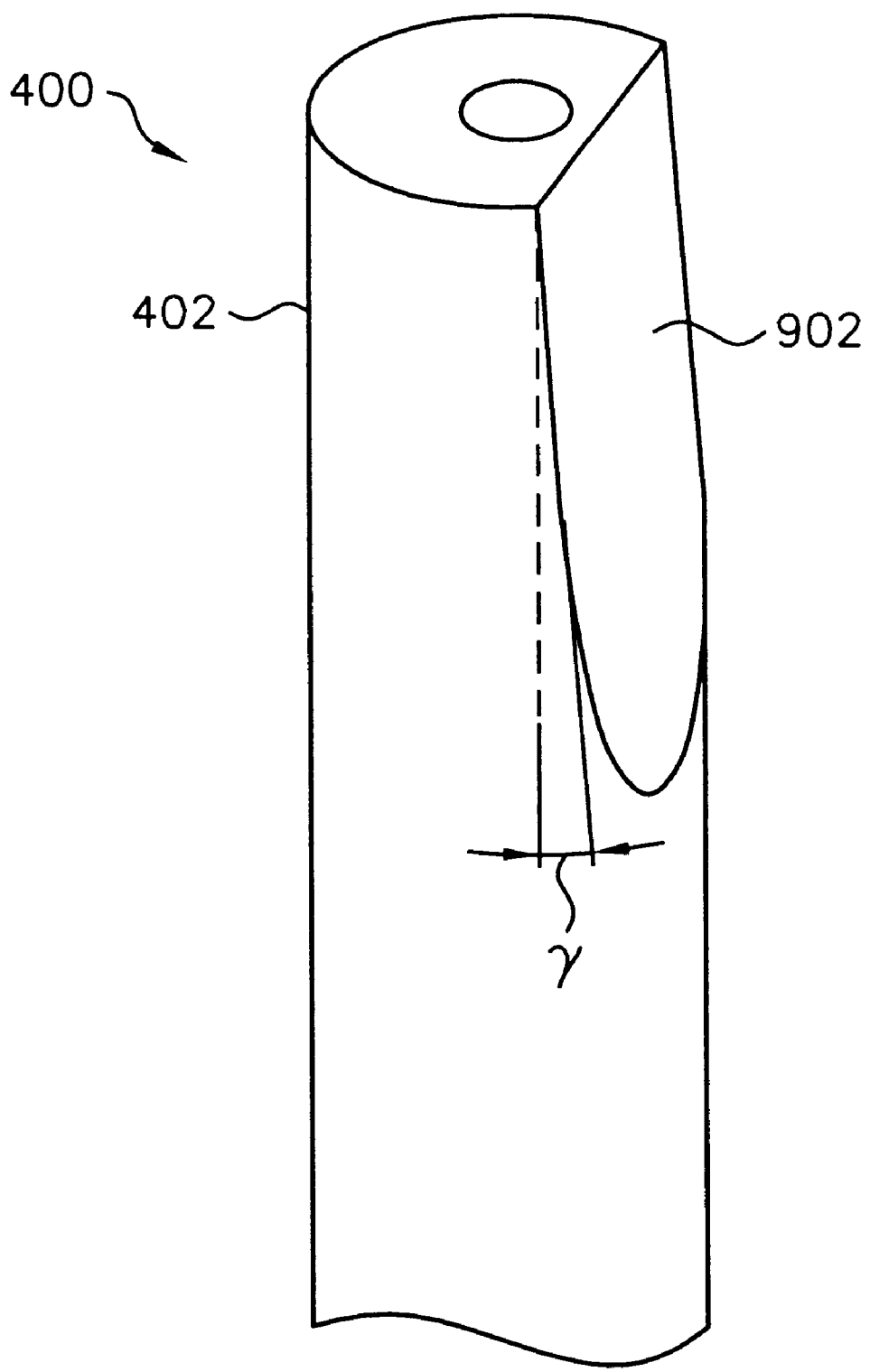

Referring to FIGS. 9A–9F, exemplary approaches for orienting bonding tool 400 within ultrasonic transducer 800 (shown in FIG. 8) are shown. In FIG. 9A, a locating flat 900 placed along an upper portion of bonding tool 400 is shown. In FIG. 9B, a beveled locating flat 902 placed along an upper portion of bonding tool 400 is shown. The beveled flat is formed at an angle $\gamma$ with respect to the longitudinal axis of bonding tool 400.

Figure 9C:
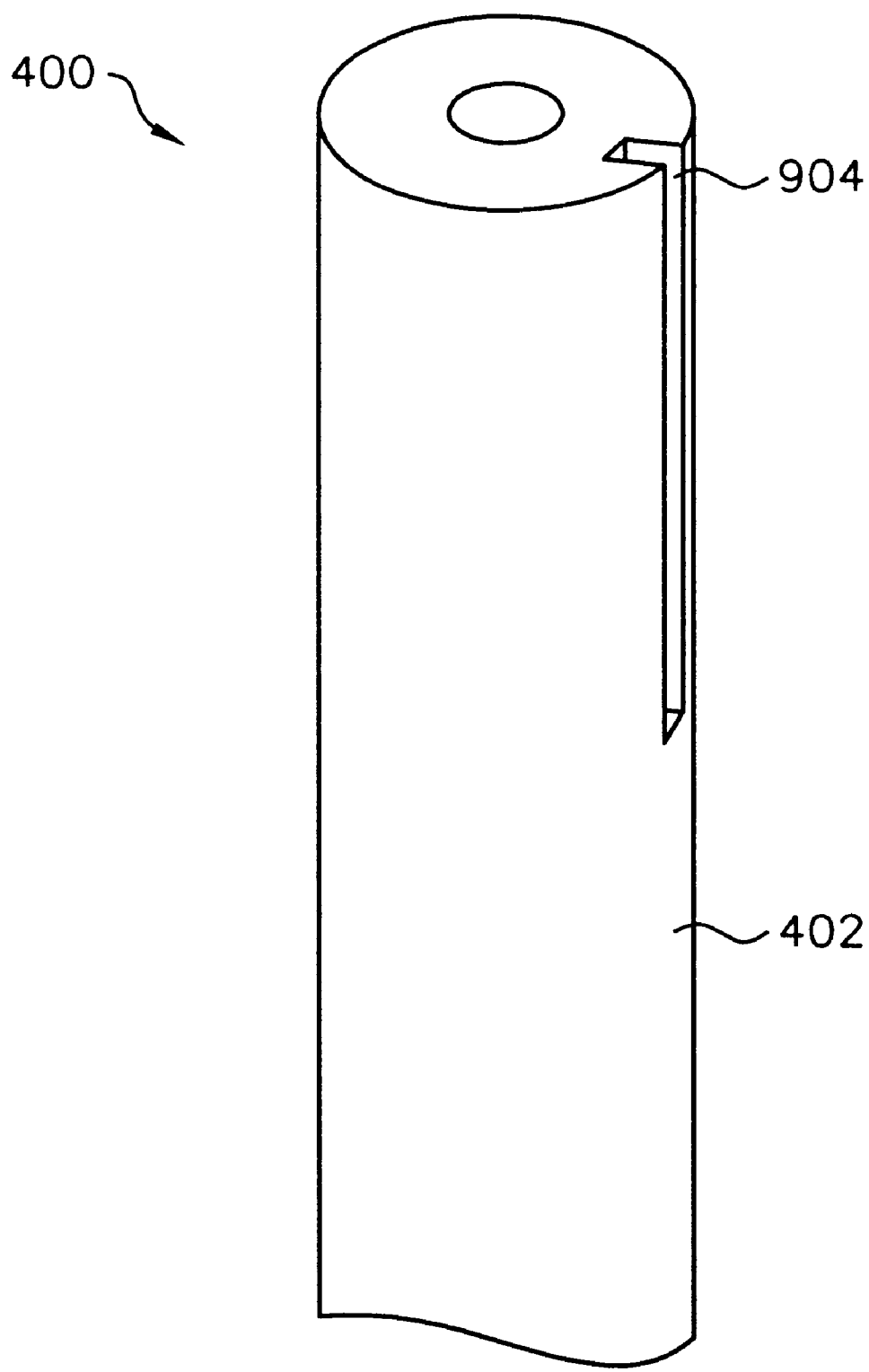
Figure 9D:
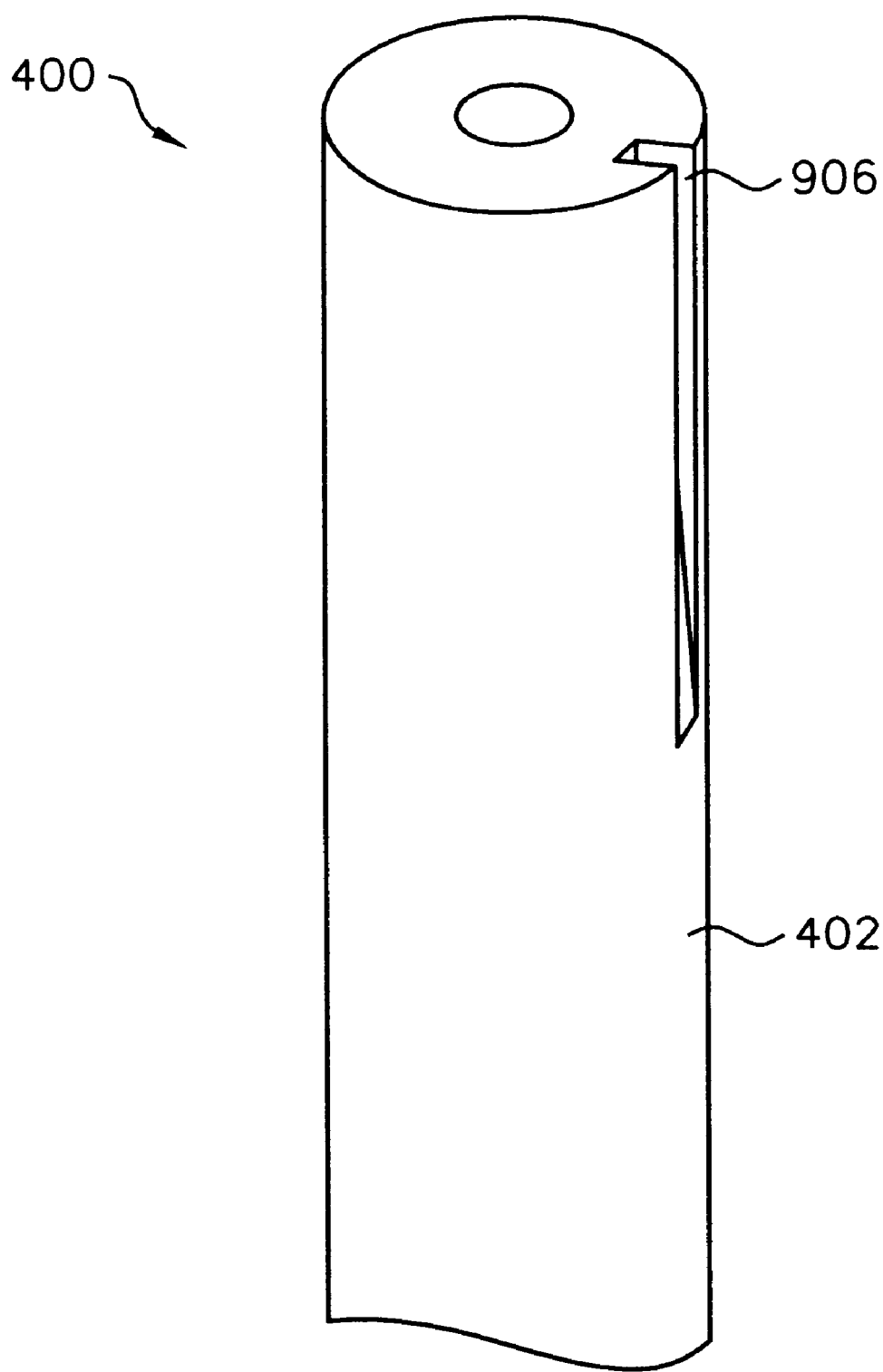
Figure 9E:
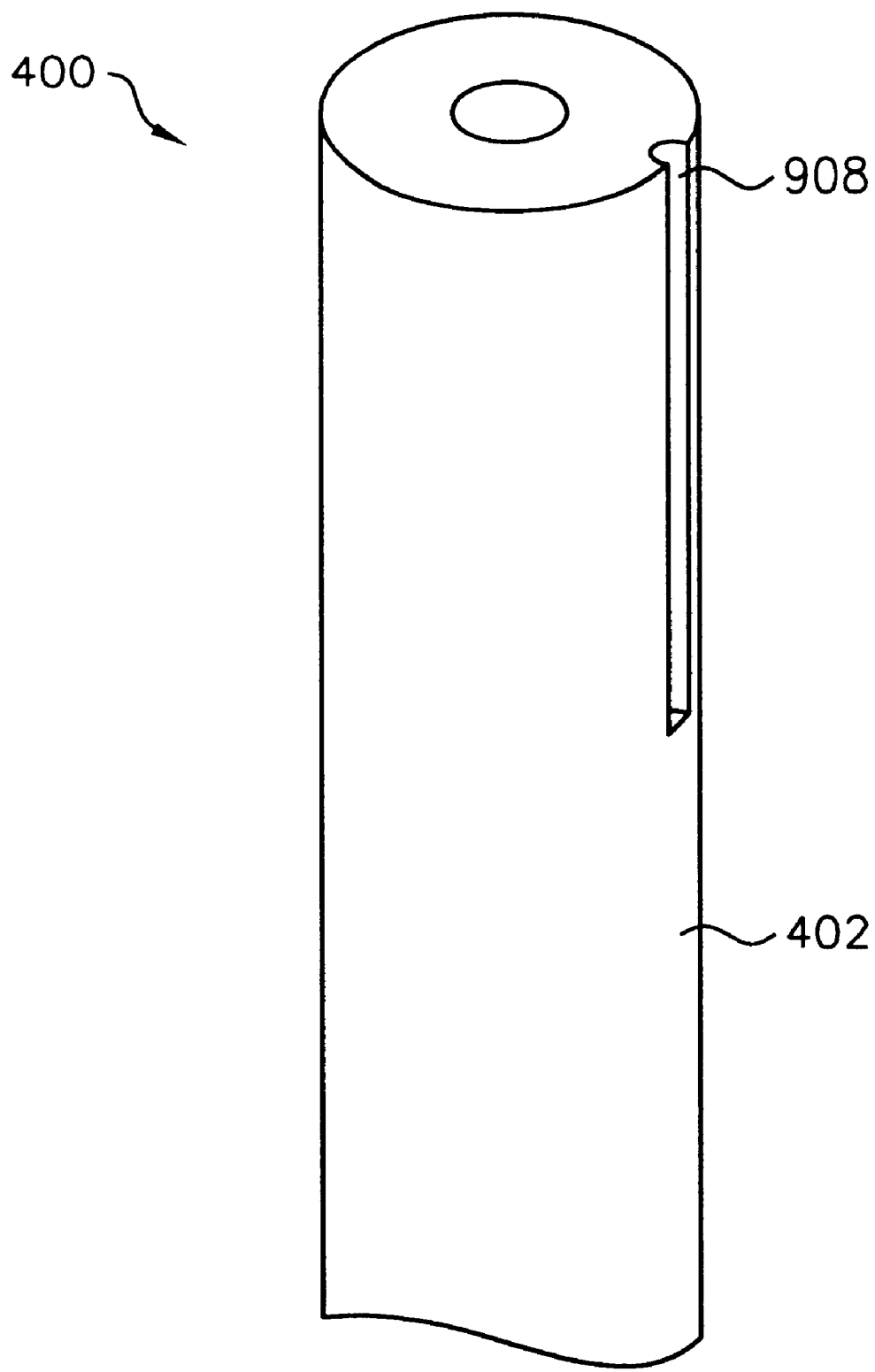
Figure 9F:
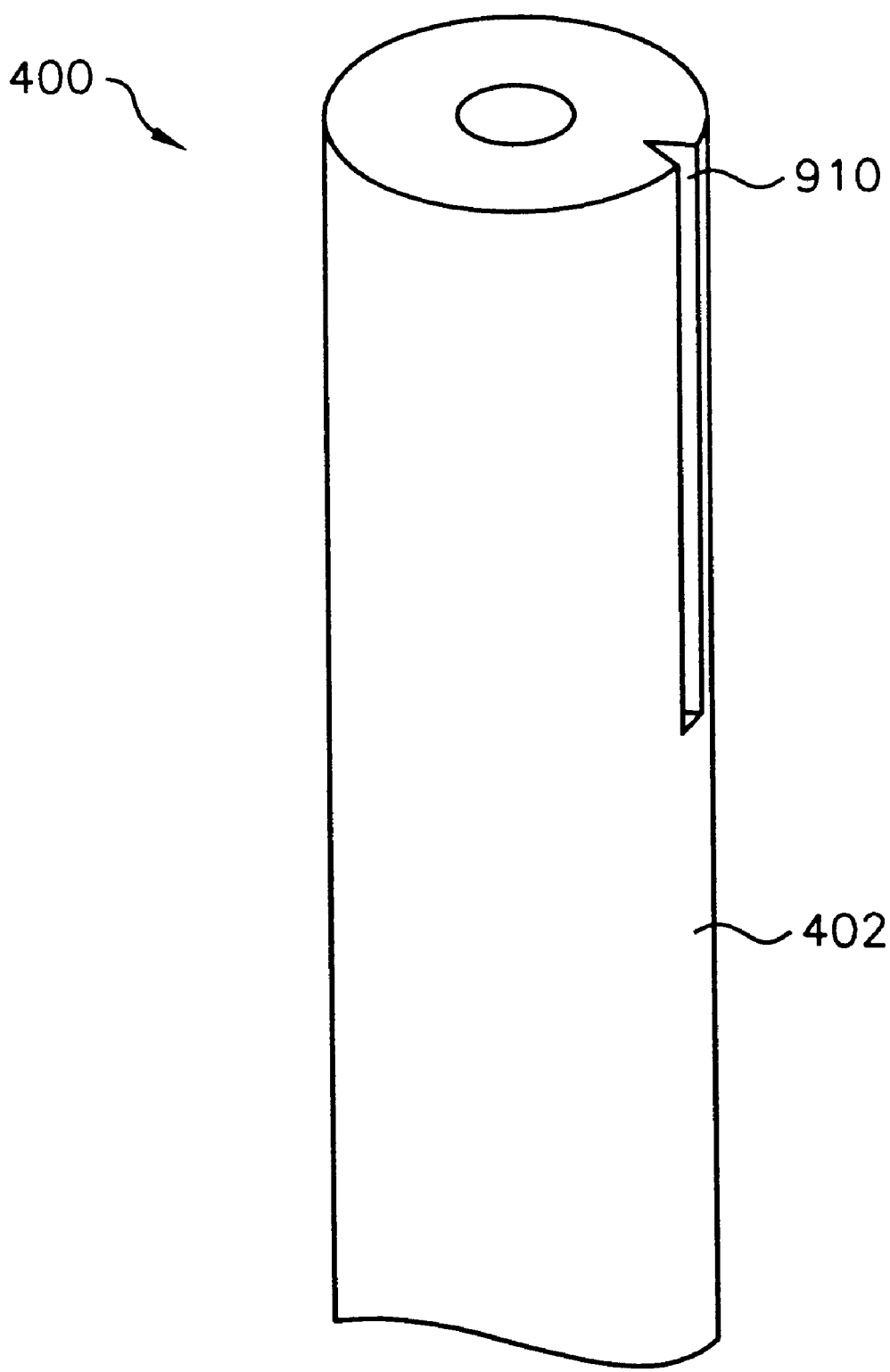
Figure 11A:
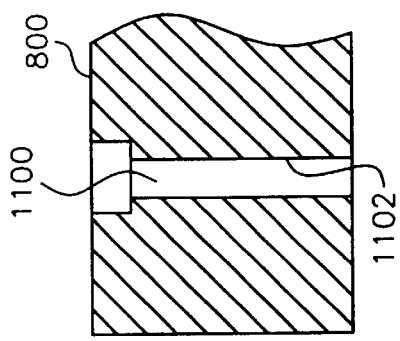
Figure 11B:
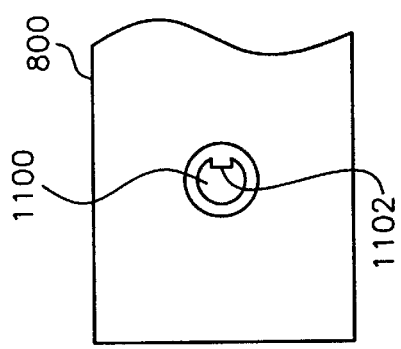
Figure 11C:
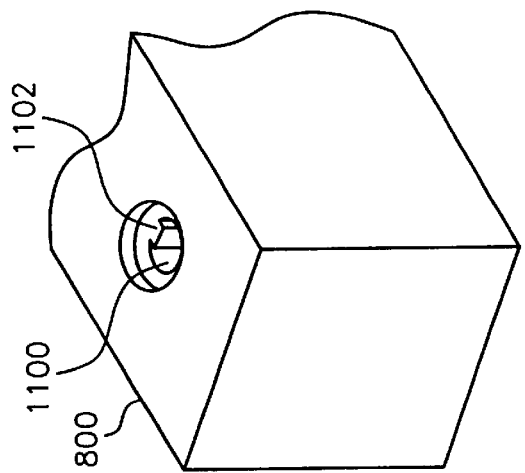
Figure 11D:
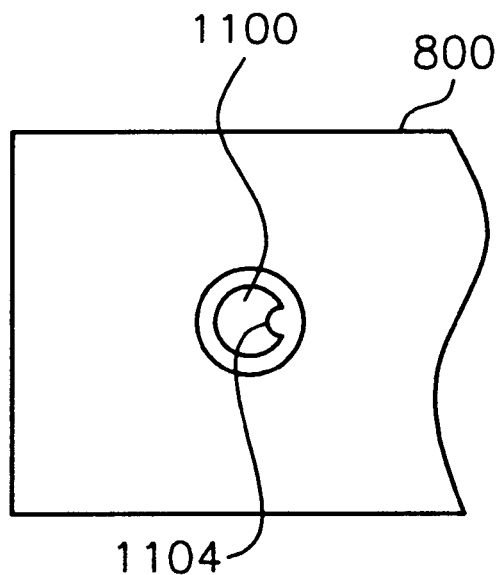
Figure 11E:
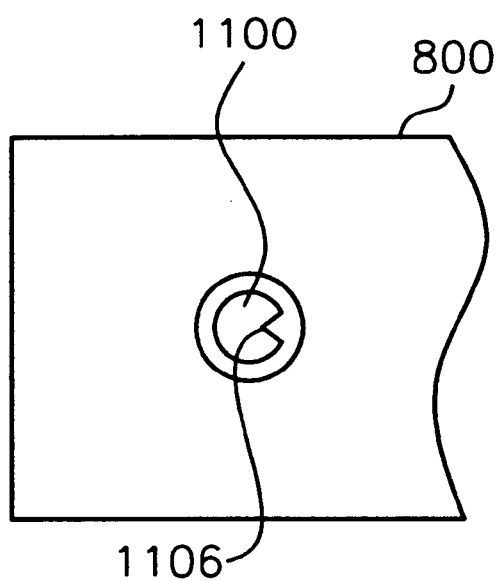

In FIG. 9C, a locating keyway 904 placed along an upper portion of bonding tool 400 is shown. In the exemplary embodiment, keyway 904 has a uniform depth orthogonal to the longitudinal axis. The invention is not so limited, however, and as shown in FIGS. 9D–9F, the keyway may have a beveled shape such as keyway 906, a curved or elliptical shape 908, or a notched shape 910. With respect to the aforementioned orienting approaches, the locator (900, 902, 904, 906, etc.) may be placed either along the same plane as planar portions 403, 405 or orthogonal thereto, depending on the specific bonding requirements. In this way, energy efficiency may be maximized in the desired direction.

Referring to FIGS. 10A–10D, the details of ultrasonic transducer 800 with respect to mating with the bonding tool (shown in FIGS. 9A and 9B) are illustrated. FIGS. 10A and 10B are a plan view and a sectional side view, respectively, of the end portion of ultrasonic transducer 800. In FIGS. 10A and 10B orifice 1000 is formed in ultrasonic transducer 800 having a flat portion 1002 to mate with locating flat 900 (shown in FIG. 9A), thereby properly orienting bonding tool 400 within ultrasonic transducer 800 to provide superior energy efficiency along a desired bonding direction. Similarly, FIG. 10C illustrates orifice 1004 having a beveled flat portion 1006 for mating with beveled locating flat 902 (shown in FIG. 9B). As shown in FIG. 10C, the flat portion 1106 of orifice 1004 is formed at a similar angle γ to that of beveled flat 902. FIG. 10D is a perspective view of the end portion of ultrasonic transducer 800 showing orifice 1000, 1004.

Similarly, FIGS. 11A–11E illustrate orifice 1100 in ultrasonic transducer 800 having a protruding portion 1102, 1104, 1106 so as to mate with appropriate locating keyway 904, 906, 908, 910 (shown in FIGS. 9C–9F). Although not shown in these figures, it is understood that protrusion 1102 may be formed at an angle to mate with beveled keyway 906 (shown in FIG. 9D). Although not specifically illustrated, it is understood that keyways 908, 910 may also be formed at an angle relative to the longitudinal direction of the bonding tool. As such, protrusions 1104, 1106, respectively, may also be formed at an appropriate angle to mate with these beveled keyways.

Figure 12C:
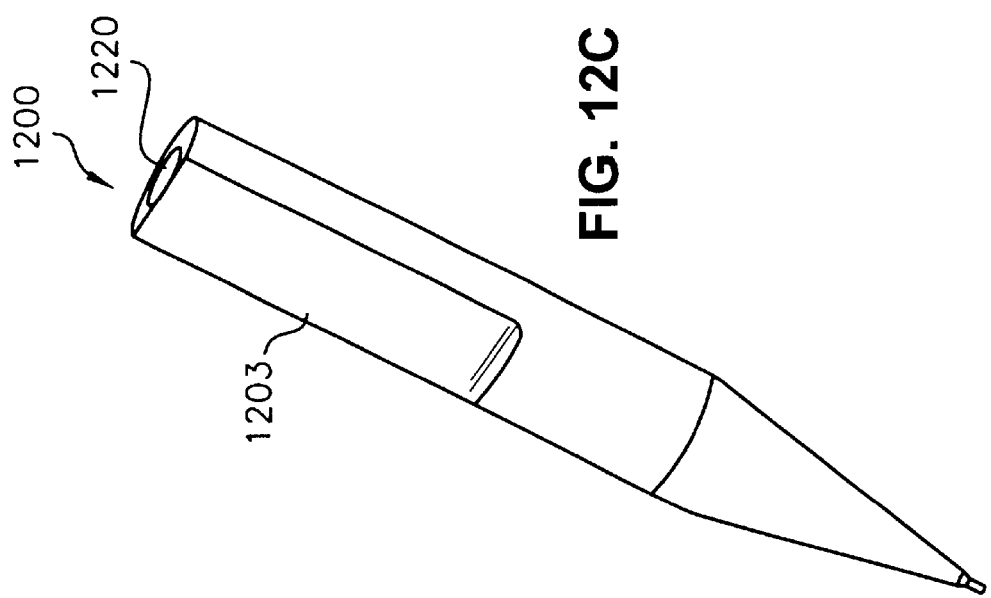
FIGS. 12A–12C are various views of a bonding tool according to a third exemplary embodiment of the present invention.
Figure 12B:
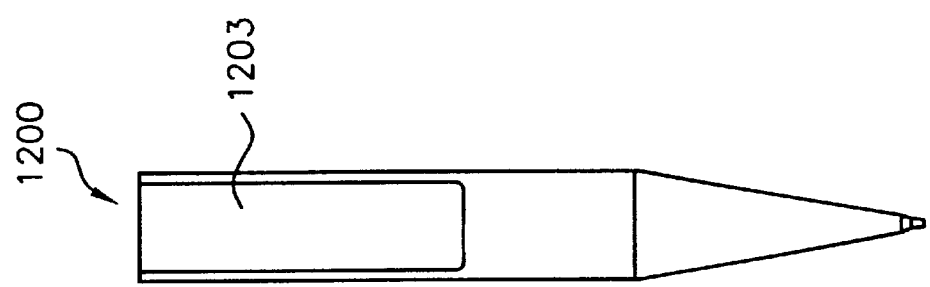
Figure 12A:
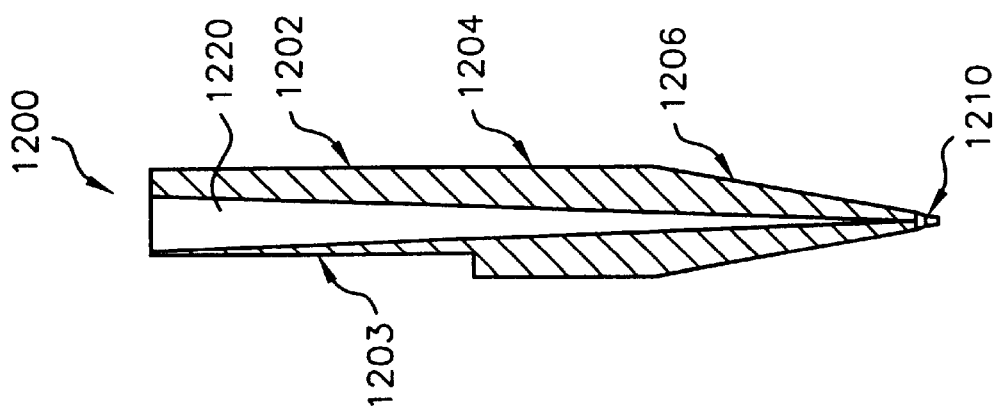

A third exemplary embodiment of the present invention is shown in FIGS. 12A–12C. FIG. 12A is a cross sectional side view of bonding tool 1200 according to the third exemplary embodiment of the present invention. As shown in FIG. 12A, bonding tool 1200 has an upper body portion 1202, a lower cylindrical body portion 1204, and a conical body portion 1206. Along a length of upper body portion 1202 is planar area 1203. In this embodiment, planar area 1203 serves to both change the mass and the moment of inertia of bonding tool 1200, and provide a means to align bonding tool 1200 in an ultrasonic transducer.

In an exemplary embodiment, the length of planar portion 1203 is about 0.177 in (4.50 mm), the diameter of the lower cylindrical section 1204 is about 0.0625 in. (1.59 mm), and the distance between the planar portion 1203 and the outer wall of upper body portion 1202 opposite the planar portion is at least 0.05 in (1.27 mm). As mentioned above, in the first exemplary embodiment, the MWT (shown in FIG. 3H for example) between the planar portion 1203 and the inside wall of axial passage 1220 must be maintained for tool integrity. In all other respects this embodiment is similar to the first and second exemplary embodiments.

Figure 13D:
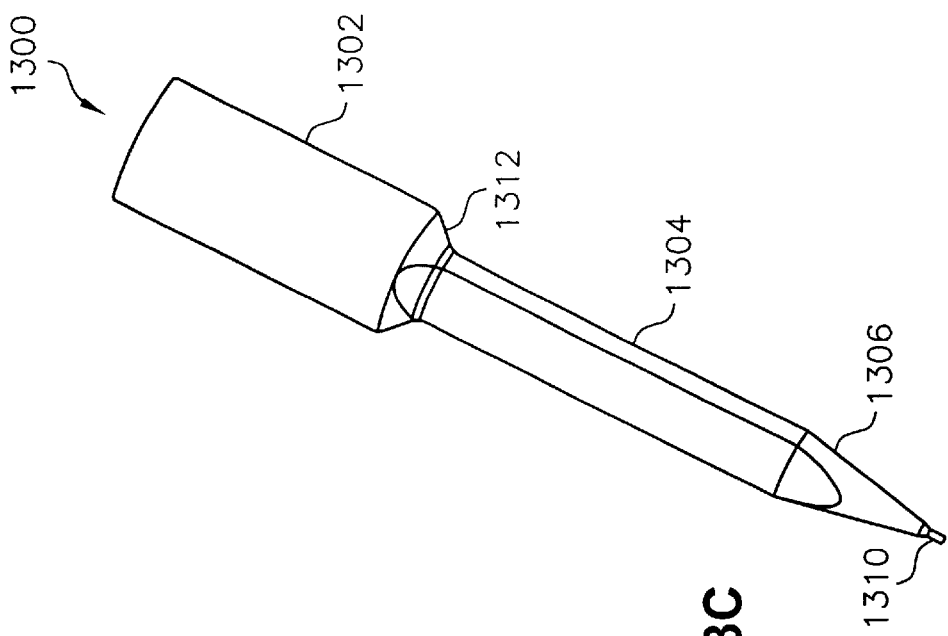
FIGS. 13A–13D are various views of a bonding tool according to a fourth exemplary embodiment of the present invention.
Figure 13C:
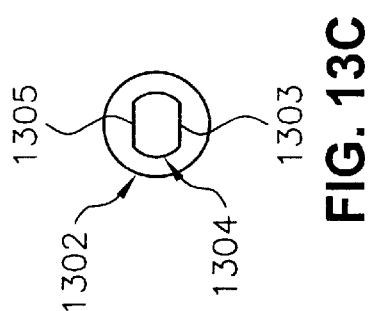
Figure 13B:
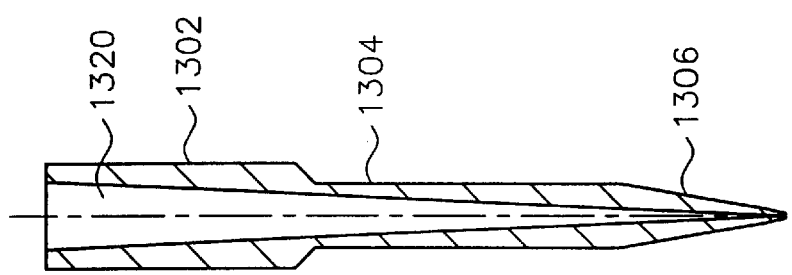
Figure 13A:
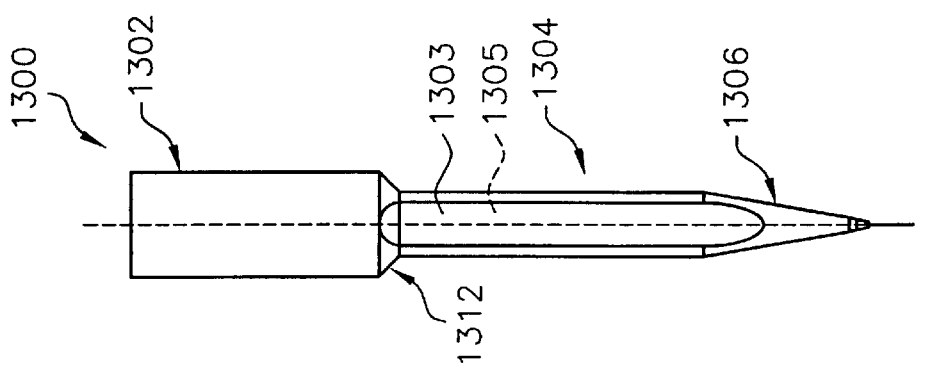

A fourth exemplary embodiment of the present invention is shown in FIGS. 13A–13D. FIG. 13A is a cross sectional side view of bonding tool 1300 according to the fourth exemplary embodiment of the present invention. As shown in FIG. 13A, bonding tool 1300 has an upper cylindrical portion 1302, a lower body portion 1304, and a conical body portion 1306. Along a length of lower body portion 1302 is planar area 1303, 1305. The fourth exemplary embodiment is a combination of the first and second exemplary embodiments. In this embodiment, lower body portion and planar area 1303, 1305 change the mass and the moment of inertia of bonding tool 1300 thereby affecting the attenuation of bonding tool 1300.

FIG. 13B is a cross-sectional side view of bonding tool 1300 illustrating orifice 1320. FIG. 13C is a plan view of bonding tool 1300 illustrating the relation between upper cylindrical portion 1302, lower body portion 1304 and planar areas 1303, 1305, and FIG. 13D is a perspective view of bonding tool 1300. As mentioned above, in the first exemplary embodiment, the MWT (shown in FIG. 3H for example) between the planar portion 1303 and the inside wall of axial passage 1320 must be maintained for tool integrity. In all other respects this embodiment is similar to the first and second exemplary embodiments.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A bonding tool for bonding a fine wire to a substrate, the bonding tool comprising:
   a first cylindrical section having a substantially uniform first diameter; and
   a second cylindrical section having a first end coupled to an end of the first cylindrical section, the second cylindrical section having i) a substantially uniform second diameter less than the first diameter and ii) a planar area along at least a portion of a length of the second section, wherein the first end of the second cylindrical section is at a predetermined distance from a tip of the bonding tool.

2. The bonding tool according to claim 1, wherein the planar area is two planar areas substantially parallel to one another on opposite sides of the second cylindrical section.

3. The bonding tool according to claim 1, further comprising a third section having a first predetermined taper, a first end of the third section coupled to a second end of the second cylindrical section.

4. The bonding tool according to claim 3, wherein the first predetermined taper has an angle of between about 17° and 31°.

5. The bonding tool according to claim 1, further comprising an axial passage extending along a longitudinal axis of the bonding tool from a first end of the bonding tool to a second end of the bonding tool.

6. The bonding tool according to claim 1, further comprising a transition section coupled between the first cylindrical section and the cylindrical second section.

7. The bonding tool according to claim 6, wherein the transition section is one of a tapered section and a curved section.

8. The bonding tool according to claim 1, wherein the distance is between about 0.200 and 0.279 inches (5.08 and 7.0866 mm).

9. A bonding tool for bonding a fine wire to a substrate, the bonding tool comprising:
   a first cylindrical section having a substantially uniform first diameter;
   a second cylindrical section having a first end coupled to an end of the first cylindrical section, the second cylindrical section having i) a substantially uniform second diameter less than the first diameter and ii) a planar area along at least a portion of a length of the second section; and
   a third section having a first predetermined taper, a first end of the third section coupled to a second end of the second cylindrical section,
   wherein the third section has a further tapered section having a second predetermined taper, the further tapered section coupled to the third section at a second end thereof.

10. The bonding tool according to claim 9, wherein the first predetermined taper has an angle of about 20° and the second predetermined taper has an angle of about 10°.

11. A bonding tool for bonding a fine wire to a substrate, the bonding tool comprising:
  a first cylindrical section having a substantially uniform first diameter;
  a second cylindrical section having a first end coupled to an end of the first cylindrical section, the second cylindrical section having i) a substantially uniform second diameter less than the first diameter and ii) a planar area along at least a portion of a length of the second section; and
  an axial passage extending along a longitudinal axis of the bonding tool from a first end of the bonding tool to a second end of the bonding tool,
  wherein the axial passage has a first diameter at a first end of the first cylindrical section and a second diameter at a tip of the first tapered section, the first diameter greater than the second diameter.

12. A bonding tool for bonding a fine wire to a substrate, the bonding tool comprising:
  a first cylindrical section having a substantially uniform first diameter; and
  a second cylindrical section having a first end coupled to an end of the first cylindrical section, the second cylindrical section having i) a substantially uniform second diameter less than the first diameter and ii) a planar area along at least a portion of a length of the second section,
  wherein the bonding tool is formed from at least one of the group consisting of aluminum oxide, silicon nitride, silicon carbide, tungsten carbide, ruby, ceramic and zirconium oxide.

13. A bonding tool for bonding a fine wire to a substrate, the bonding tool comprising:
  a first cylindrical section having a substantially uniform first diameter; and
  a second cylindrical section having a first end coupled to an end of the first cylindrical section, the second cylindrical section having i) a substantially uniform second diameter less than the first diameter and ii) a planar area along at least a portion of a length of the second section,
  wherein the bonding tool is formed from a unitary piece of material.

14. A bonding tool for bonding a fine wire to a substrate, the bonding tool comprising:
  a first cylindrical section having a substantially uniform first diameter;
  a second section having a first end coupled to a first end of the first cylindrical section, the second cylindrical section having i) a diameter substantially equal to the first diameter of the first cylindrical section and ii) a planar area along at least a portion of a length of the second section; and
  a third section having a first predetermined taper, a first end of the third section coupled to an end of the second cylindrical section,
  wherein the first end of the third section is at a predetermined distance from a tip of the bonding tool.

15. The bonding tool according to claim 14, wherein the planar area is two planar areas substantially parallel to one another on opposite sides of the second section.

16. The bonding tool according to claim 15, wherein a distance between the planar surfaces is between about 0.0345 and 0.0625 inches (0.8763 and 1.5875 mm).

17. The bonding tool according to claim 14, wherein the planar area extends onto a portion of the third section.

18. The bonding tool according to claim 14, wherein the first predetermined taper has an angle of between about 17° and 31°.

19. The bonding tool according to claim 14, wherein the tapered section has a further tapered section having a second predetermined taper, the further tapered section coupled to the third section at a second end thereof.

20. The bonding tool according to claim 19, wherein the first predetermined taper has an angle of about 20° and the second predetermined taper has an angle of about 10°.

21. The bonding tool according to claim 14, further comprising an axial passage extending along a longitudinal axis of the bonding tool from a first end of the bonding tool to a second end of the bonding tool.

22. The bonding tool according to claim 21, wherein the axial passage has a first diameter at a first end of the first cylindrical section and a second diameter at a tip of the tapered section, the first diameter greater than the second diameter.

23. The bonding tool according to claim 14, wherein the first end of the second section is at a predetermined distance from an end of the bonding tool.

24. The bonding tool according to claim 23, wherein the distance is between about 0.200 and 0.279 inches (5.08 and 7.0866 mm).

25. The bonding tool according to claim 14, wherein the bonding tool is formed from a unitary piece of material.

26. A bonding tool for use with a transducer, the bonding tool comprising:
  a first cylindrical section having a substantially uniform first diameter;
  a second cylindrical section having a first end coupled to an end of the first cylindrical section, the second cylindrical section having i) a substantially uniform second diameter less than the first diameter and ii) a planar area along at least a portion of a length of the second section; and
  a guide disposed at a first end of the first cylindrical section, wherein the guide positions the bonding tool within the transducer.

27. The bonding tool according to claim 26, wherein the guide is one of a planar portion and an orifice formed along an upper portion of the first cylindrical section.

* * * * *